United States Patent
Kim et al.

(10) Patent No.: US 11,325,213 B2
(45) Date of Patent: May 10, 2022

(54) SEPARABLE ELECTRONIC DEVICE AND PROCESS METHOD THEREFOR

(71) Applicants: SAMSUNG ELECTRONICS CO., LTD., Gyeonggi-do (KR); HAN TECHNOLOGY CO., LTD., Gyeonggi-do (KR)

(72) Inventors: Minjae Kim, Gyeonggi-do (KR); Ohsung Kwon, Gyeonggi-do (KR); Youngjin Kim, Gyeonggi-do (KR); Sangkyu Park, Gyeonggi-do (KR); Sungkeun Park, Gyeonggi-do (KR); Seungyeol Oh, Gyeonggi-do (KR); Minwoo Lee, Gyeonggi-do (KR); Jinhee Lee, Gyeonggi-do (KR)

(73) Assignees: Samsung Electronics Co., Ltd; Han Technology Co., Ltd

( * ) Notice: Subject to any disclaimer, the term of this patent is extended or adjusted under 35 U.S.C. 154(b) by 58 days.

(21) Appl. No.: 16/769,973

(22) PCT Filed: Nov. 21, 2018

(86) PCT No.: PCT/KR2018/014338
§ 371 (c)(1),
(2) Date: Jun. 4, 2020

(87) PCT Pub. No.: WO2019/112208
PCT Pub. Date: Jun. 13, 2019

(65) Prior Publication Data
US 2020/0384586 A1    Dec. 10, 2020

(30) Foreign Application Priority Data
Dec. 8, 2017    (KR) .......................... 10-2017-0168595

(51) Int. Cl.
*B32B 43/00*    (2006.01)
*B23P 19/04*    (2006.01)

(52) U.S. Cl.
CPC .............. *B23P 19/04* (2013.01); *B32B 43/00* (2013.01); *B32B 43/006* (2013.01);
(Continued)

(58) Field of Classification Search
CPC . B32B 38/10; B32B 43/006; Y10T 156/1132; Y10T 156/1158;
(Continued)

(56) References Cited

U.S. PATENT DOCUMENTS 7,384,811 B2 *    6/2008    Miyamoto ........ H01L 21/67132
                                                                    438/33
8,376,017 B2 *    2/2013    Lee ....................... B32B 43/006
                                                                    156/752
(Continued)

FOREIGN PATENT DOCUMENTS

JP    2014116937    6/2014
KR    1020100092560    8/2010
(Continued)

OTHER PUBLICATIONS

Translation of specification of KR 2004/75946 (Year: 2004).*
PCT/ISA/210 Search Report issued on PCT/KR2018/014338, pp. 5.
PCT/ISA/237 Written Opinion issued on PCT/KR2018/014338, pp. 6.

*Primary Examiner* — Philip C Tucker
*Assistant Examiner* — Nickolas R Harm
(74) *Attorney, Agent, or Firm* — The Farrell Law Firm, P.C.

(57) ABSTRACT

According to various embodiments of the present invention, an electronic device comprises: a heating unit, which includes a lower heating unit and an upper heating unit rotatably coupled to the lower heating unit, and heats an (Continued)

external electronic device mounted on at least one surface of the lower heating unit; a fixing unit, which is disposed to be adjacent to the lower heating unit, and has at least one part formed to be movable in the longitudinal direction of the lower heating unit, thereby fixing the external electronic device; a adsorption unit having one part, which is inserted into at least one recess formed on the upper heating unit, and adsorbing at least a region of the external electronic device; and a driving unit, which is disposed at one side or a surrounding part of the heating unit, can move in the direction perpendicular to the moving direction of the fixing unit, and rotates the upper heating unit by pressurizing the same.

15 Claims, 18 Drawing Sheets

(52) U.S. Cl.
CPC ....... *B32B 2457/20* (2013.01); *Y10S 156/924* (2013.01); *Y10S 156/937* (2013.01); *Y10T 156/1132* (2015.01); *Y10T 156/1153* (2015.01); *Y10T 156/1158* (2015.01); *Y10T 156/1911* (2015.01); *Y10T 156/1944* (2015.01)

(58) Field of Classification Search
CPC ......... Y10T 156/1944; Y10T 156/1911; Y10S 156/924; Y10S 156/937
See application file for complete search history.

(56) References Cited

U.S. PATENT DOCUMENTS

| | | | | |
|---|---|---|---|---|
| 8,997,822 | B2* | 4/2015 | Iwashita | H01L 21/6715 156/758 |
| 2004/0168764 | A1* | 9/2004 | Anker | H01L 21/67092 156/706 |
| 2011/0008222 | A1* | 1/2011 | Bushman | G21F 5/015 422/307 |
| 2011/0048630 | A1* | 3/2011 | Hase | H01L 21/67132 156/272.2 |
| 2013/0133838 | A1* | 5/2013 | Kim | B32B 43/006 156/707 |
| 2014/0020846 | A1* | 1/2014 | Hirakawa | B32B 38/10 156/711 |
| 2014/0102145 | A1* | 4/2014 | Teck | B26D 7/10 65/112 |
| 2014/0158306 | A1* | 6/2014 | Lu | B32B 43/006 156/752 |
| 2014/0209250 | A1* | 7/2014 | Kawagoe | B32B 43/006 156/701 |
| 2015/0083342 | A1* | 3/2015 | George | H01L 21/6835 156/711 |
| 2016/0018587 | A1* | 1/2016 | Koraishy | G02B 6/0065 156/708 |

FOREIGN PATENT DOCUMENTS

| | | |
|---|---|---|
| KR | 200475946 | 1/2015 |
| KR | 101549506 | 9/2015 |
| KR | 1020170092899 | 8/2017 |
| KR | 200484620 | 9/2017 |
| KR | 101791525 | 11/2017 |

* cited by examiner

SEPARABLE ELECTRONIC DEVICE AND PROCESS METHOD THEREFOR

PRIORITY

This application is a National Phase Entry of International Application No. PCT/KR2018/014338, which was filed on Nov. 21, 2018, and claims priority to Korean Patent Application No. 10-2017-0168595 filed in the Korean Intellectual Property Office on Dec. 8, 2017, the content of each of which is incorporated herein by reference.

TECHNICAL FIELD

Various embodiments of the present disclosure relate to a separable electronic device and a processing method of the same.

BACKGROUND ART

Electronic devices may refer to devices that perform particular functions based on embedded programs, such as home appliances, electronic notes, portable multimedia players (PMPs), and mobile communication terminals, tablet personal computers (PCs), video/audio devices, desktop/laptop computers, vehicle navigation systems, and so forth.

With the increasing integration of electronic devices and the common use of ultra-high-speed and large-volume wireless communication, various functions have been recently provided through a single electronic device such as a mobile communication terminal. With the increasing integration of electronic devices and the common use of ultra-high-speed and large-volume wireless communication, various functions have been recently provided through a single electronic device such as a mobile communication terminal.

To repair a high-integration electronic device such as the mobile communication terminal, separation of a surface of a cover without damaging an internal part is required.

A general separable electronic device may include a plurality of devices and a plurality of processes to separate the surface of the cover of the electronic device such as the mobile communication terminal. For example, processing may be performed through a separate process of heating the mobile communication terminal, performing movement for separation, performing mounting and adsorption with respect to a new module, and separating the surface of the cover and a separate device.

DETAILED DESCRIPTION OF THE INVENTION

Technical Problem

As a separable electronic device uses various devices to separate a front cover or a rear cover of an external electronic device such as a mobile device, a process may be complex and time consuming. For example, after the external electronic device is heated, a process of moving and mounting the heated external electronic device to and on a new device is required for separation, such that the external electronic device may be exposed to an external atmosphere, causing heat loss. In another example, after a worker recognizes whether the external electronic device is heated, a next process needs to be performed, such that when the worker fails in recognition, a delay may occur in the process or damage may occur due to excessive overheating. In another example, a separable adsorption member may be easily abraded and in the case of abrasion, adsorptive power with respect to the front cover or the rear cover may be degraded, damaging the external electronic device.

According to various embodiments of the present disclosure, a separable electronic device and a separation process may be provided, in which by implementing an integral separable device, a process for separating an external electronic device may be simplified and thus the efficiency and accuracy of a repair process may be improved.

According to various embodiments of the present disclosure, a separable electronic device and a separation process may be provided, in which by implementing an integral separable device, a repair process may be minimized.

According to various embodiments of the present disclosure, a uniform repair result may be provided by minimizing an influence of a repair result on a skill level of a worker.

According to various embodiments of the present disclosure, a separable electronic device and a separation process may be provided, in which a repair cost may be reduced by minimizing damage to a front cover and a rear cover of an external electronic device.

Technical Solution

A separable electronic device according to various embodiments of the present disclosure may include a heating unit including a lower heating unit and an upper heating unit rotatably coupled with the lower heating unit, and heating an external electronic device placed on at least one surface of the lower heating unit, a fixing unit arranged adjacent to the lower heating unit, at least a part of the fixing unit being formed to move in a longitudinal direction of the lower heating unit to fix the external electronic device, an adsorption unit, a part of which is inserted into at least one recess formed in the upper heating unit, to adsorb at least a region of the external electronic device, and a driving unit arranged in a side or in a periphery of the heating unit, being movable perpendicular to a moving direction of the fixing unit, and rotating the upper heating unit by pressurizing the upper heating unit.

A processing method of a separable electronic device according to various embodiments of the present disclosure may include placing an external electronic device in a region of a lower heating unit, fixing the external electronic device, by a fixing unit movable in a longitudinal direction of the lower heating unit, approaching the external electronic device through rotational movement of an upper heating unit with respect to the lower heating unit and adsorbing the external electronic device, by an adsorption unit arranged in the upper heating unit, providing heat to at least one surface of the external electronic device, by the upper heating unit and the lower heating unit, and spacing the upper heating unit away from the lower heating unit through upward movement of the driving unit and separating a cover formed on a surface of the external electronic device.

Advantageous Effects

The separable electronic device and the separation process according to various embodiments of the present disclosure may be implemented as an integral device to simplify a process for separating the external electronic device, thus improving the efficiency and accuracy of a repair process.

The separable electronic device and the separation process according to various embodiments of the present disclosure may minimize a repair space due to the integral device and configure an order of operations different from an order in an existing process, thus saving a time.

According to various embodiments of the present disclosure, the separable electronic device and the separation process may provide a uniform repair result by minimizing an influence of a repair result on a skill level of a worker.

The separable electronic device and the separation process according to various embodiments of the present disclosure may reduce a repair cost by minimizing damage to the front cover and the rear cover of the external electronic device.

MODE FOR CARRYING OUT THE INVENTION

Figure 1:
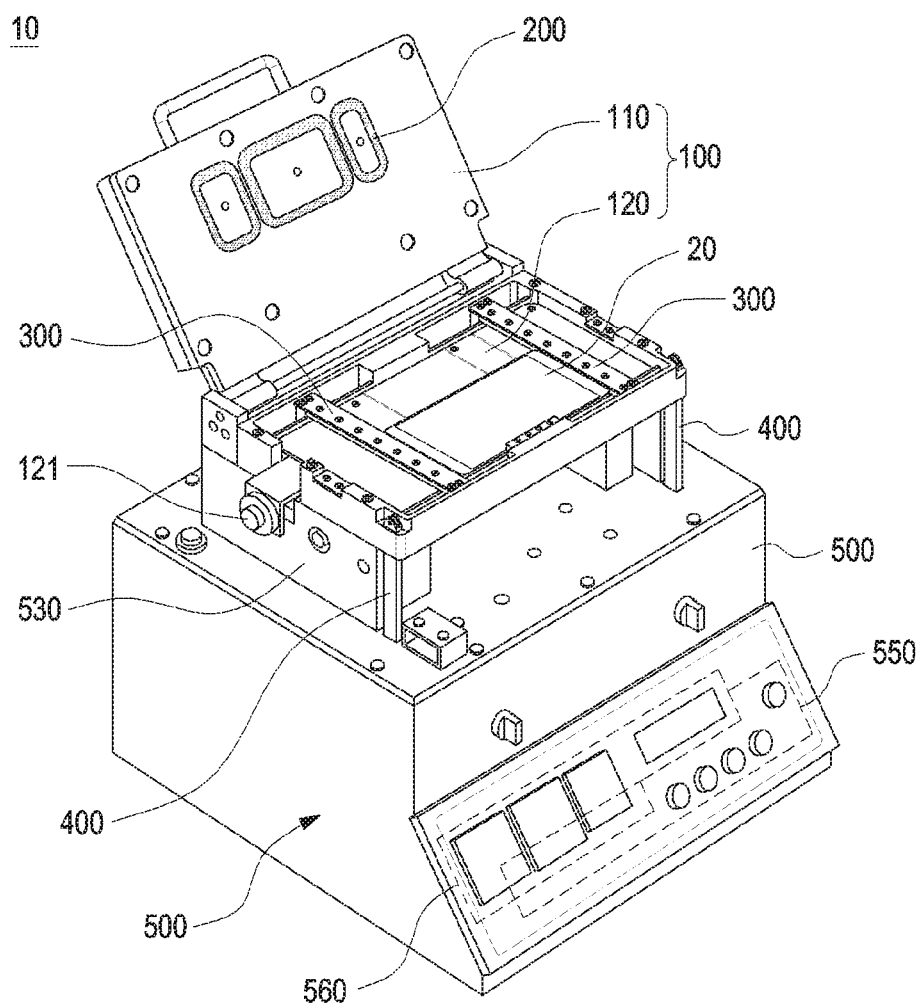
FIG. 1 is a block diagram of a separable electronic device 10 according to various embodiments of the present disclosure.

An electronic device according to various embodiments may be one of various types of electronic devices, according to various embodiments of the present disclosure. The electronic devices may include, for example, at least one of a computer device, a portable communication device (e.g., a smart phone), a portable multimedia device, a portable medical device, a camera, a wearable device, a home appliance, or a device for separating/disassembling the devices. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Expressions such as "first," "second," "primarily," or "secondary," used herein may represent various elements regardless of order and/or importance and do not limit corresponding elements. When it is described that an element (such as a first element) is "operatively or communicatively coupled with/to" or "connected" to another element (such as a second element), the element can be directly connected to the other element or can be connected to the other element through another element (e.g., a third element).

A term "module" used herein may mean, for example, a unit including one of or a combination of two or more of hardware, software, and firmware, and may be used interchangeably with terms such as logic, a logic block, a part, or a circuit. The module may be a single integral component, or a minimum unit or part thereof, adapted to perform one or more functions. For example, the module may be implemented as an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). The machine may invoke stored instructions from the storage medium and operate according to the invoked instructions, and may include an electronic device (e.g., the electronic device 101) according to the disclosed embodiments. When the instructions are executed by a processor (for example, the processor 120), functions corresponding to the instructions may be performed directly by the processor or using other components under control of the processor. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and one or more of the above-described components may be omitted, or one or more other components may be added. Alternatively or additionally, a plurality of components (e.g., modules or programs) may be integrated into a single component, and the integrated component may still perform one or more functions of each of the plurality of components in the same or similar manner as they are performed by a corresponding one of the plurality of components before the integration. Operations performed by the module, the program, or another component according to various embodiments may be carried out sequentially, in parallel, repeatedly, or heuristically, or one or more of the operations may be executed in a different order or omitted, or one or more other operations may be added. Hereinafter, an electronic device according to various embodiments of the present disclosure will be described with reference to the accompanying drawings. Herein, the term "worker" used in various embodiments of the present disclosure may refer to a person who uses the electronic device or a device using the electronic device (e.g., an artificial intelligence electronic device).

Figure 2:
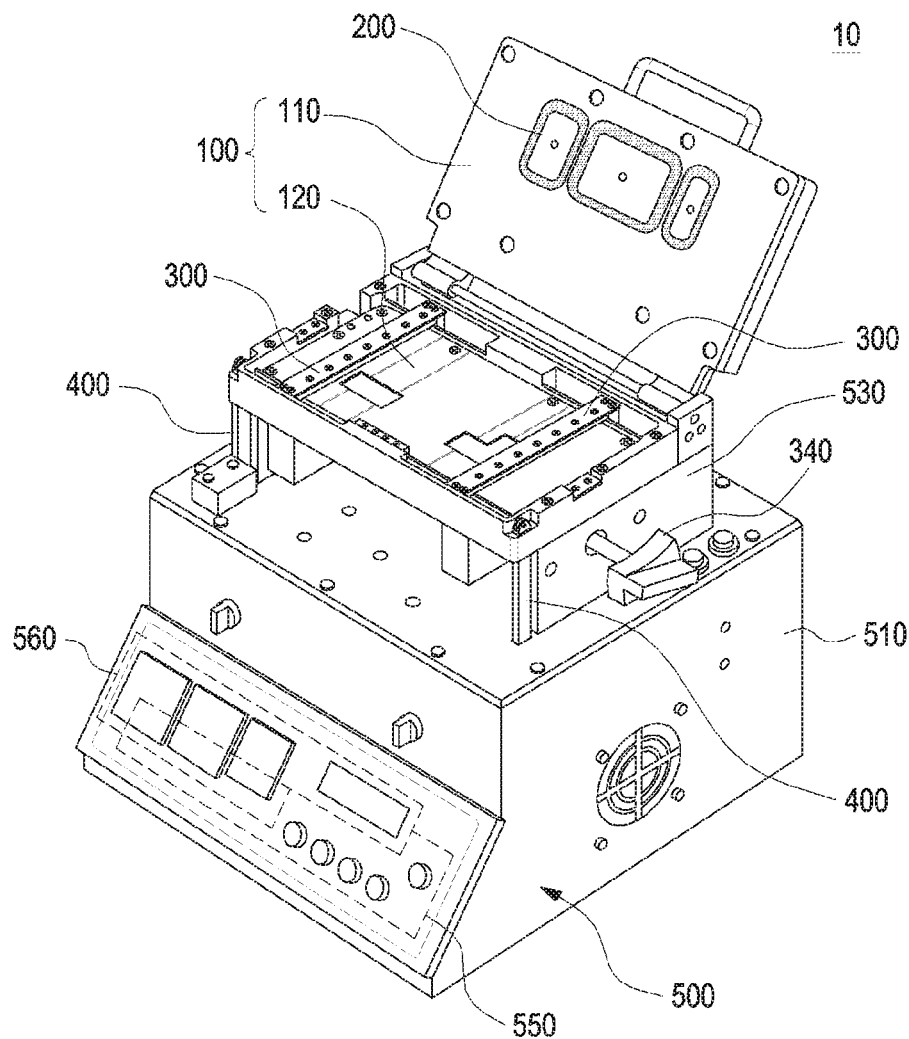
FIG. 2 is a perspective view of a separable electronic device 10 viewed from a direction that is different from FIG. 1, according to various embodiments of the present disclosure.
Figure 3:
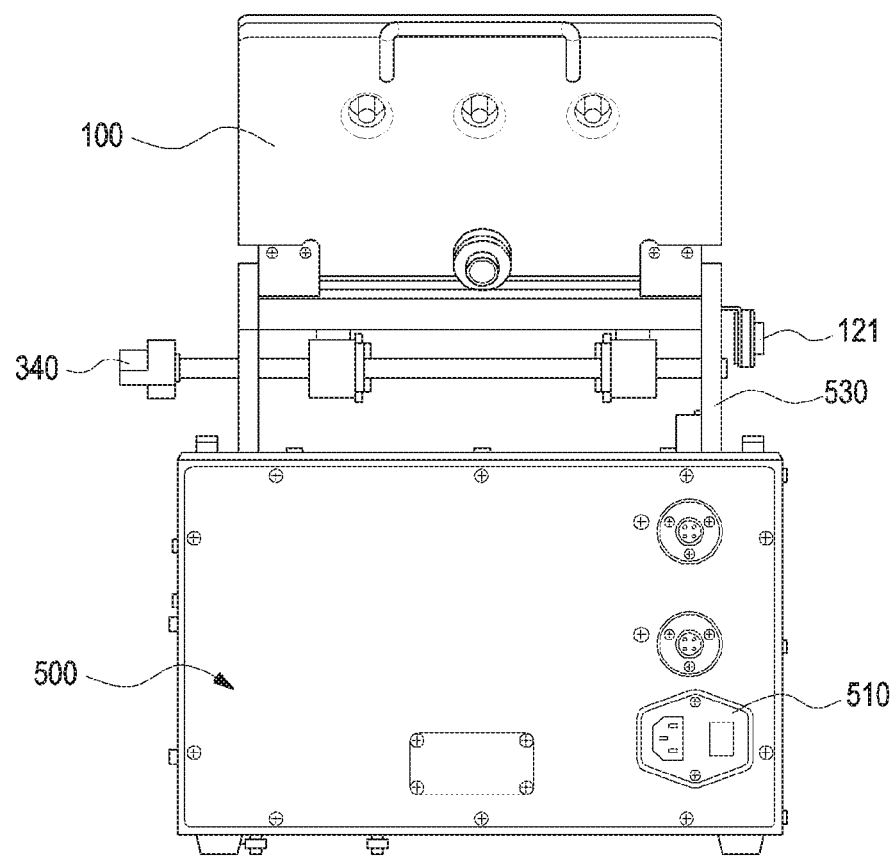
FIG. 3 is a perspective view of a rear surface of a separable electronic device 10, according to various embodiments of the present disclosure.
Figure 4:
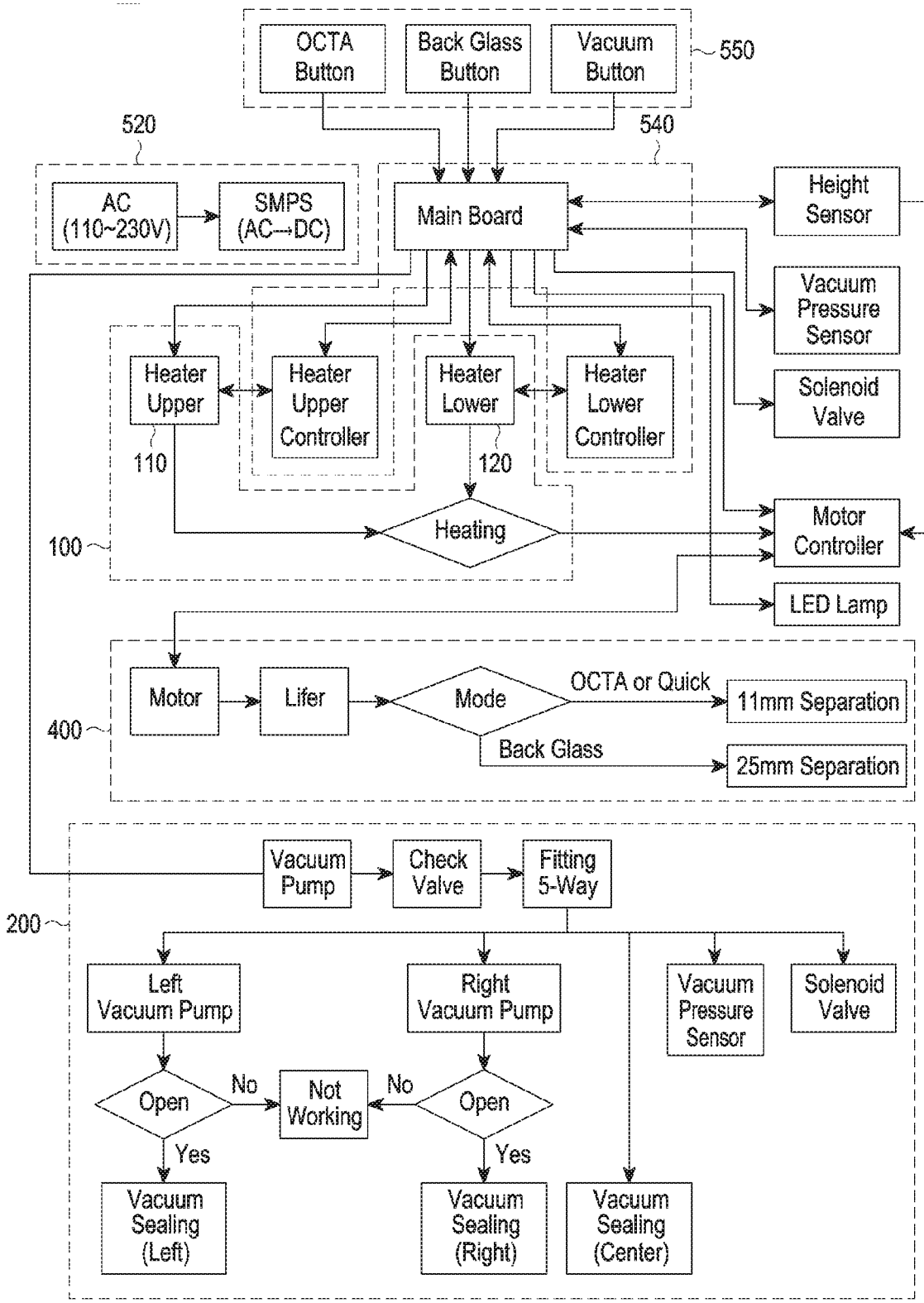
FIG. 4 is a block diagram of a separable electronic device 10 according to various embodiments of the present disclosure.

FIG. 1 is a block diagram of a separable electronic device 10 according to various embodiments of the present disclosure. FIG. 2 is a perspective view of the separable electronic device 10 viewed from a direction that is different from FIG. 1, according to various embodiments of the present disclosure. FIG. 3 is a perspective view of a rear surface of the separable electronic device 10, according to various embodiments of the present disclosure. FIG. 4 is a block diagram of the separable electronic device 10 according to various embodiments of the present disclosure.

In FIGS. 1 through 3, in a three-axis orthogonal coordinate system, 'X' may denote the length direction of the separable electronic device 10, 'Y' may denote the width direction of the separable electronic device 10, and 'Z' may denote the thickness direction of the separable electronic device 10. In an embodiment of the present disclosure, 'Z' may mean a first direction+Z and a second direction−Z, 'Y' may mean a third direction+Y and a fourth direction−Y, and 'X' may mean a fifth direction+X and a sixth direction−X.

According to various embodiments, the separable electronic device 10 may be used to separate a cover of an external electronic device (e.g., a mobile device) 20. The external electronic device 20 from which the cover is separated may be provided in a state where an internal part, etc., may be repaired and/or replaced.

According to an embodiment, the separable electronic device 10 may perform the first step for disassembling the external electronic device 20, a process of separating a front cover and/or a rear cover of the external electronic device 20. For example, the front cover of the external electronic device 20 may be an OCTA display, and the rear cover may be back glass.

According to an embodiment, a separation process of the external electronic device 20 may be performed in an order of mounting, adsorption, heating, and separation. The processing order may be different from a general processing order (e.g., heating, moving, mounting, adsorption, and then separation), and the processing is performed by one integral equipment rather than by a separate device and a separate task, thus improving the efficiency and accuracy of a repairing process and significantly reducing a damage rate.

As shown in FIGS. 1 through 4, the separable electronic device 10 may include a main body portion 500, a heating unit 100, an adsorption unit 300, a fixing unit 300, and a driving unit 400.

According to various embodiments, the main body portion 500 may include a housing 510, a power source unit 520, a support member 530, a control circuit 540, a data input unit 550, and a data output unit 560. The housing 510 may provide a space for accommodating various electronic parts and at least a part thereof may include a conductive material. For example, the housing 510 may have a form of a box, and safely protect various electronic parts accommodated therein.

According to various embodiments, the support member 530 may be mounted on a surface of the housing 510. The support member 530 may include a metal and/or plastic material, and may be formed in the first direction+Z of the housing 510 to support the heating unit 100, the adsorption unit 200, and the fixing unit 300. The support member 530 and/or the housing 510 may reinforce rigidity of the separable electronic device 10.

According to various embodiments, the power source unit 520 may be formed inside the housing 510 and thus may be supplied with power from outside. The power source unit 520 may provide power to the main body portion 500 and various components (e.g., the heating unit 100, the adsorption unit 200, the fixing unit 300 and/or the driving unit 400) that are electrically connected with the main body portion 500 through an externally exposed connector.

According to various embodiments, a printed circuit unit including a main board and a printed circuit board (PCB) mounted on the main board may be accommodated inside the housing 510. For example, on the printed circuit unit, a processor, a communication module, various interfaces, a power management module, etc., may be mounted in the form of an integrated circuit chip. In an example, a control circuit may include an integrated circuit chip and may be mounted on the printed circuit unit. For example, the control circuit may be a part of the processor or the communication module. According to an embodiment, the processor may drive, e.g., software to control at least one other component (e.g., a hardware or software component) of the electronic device connected with the processor and may process or compute various data. The processor may load a command or data received from another element (e.g., a sensor or communication module) into a volatile memory to process the command or data, and stores result data in the non-volatile memory. According to an embodiment, the processor may include a main processor (e.g., a central processing unit (CPU) or an application processor (AP)) and an auxiliary processor that is operable independently from the main processor. In addition to, or instead of, the main processor 121, the auxiliary processor may include an auxiliary processor that consumes less power than the main processor or is specified for a designated function. Here, the auxiliary processor may be operated separately from or embedded in the main processor.

According to an embodiment, the control circuit may control operations of the heating unit 100, the adsorption unit 200, and/or the driving unit 400. The control circuit 540 may separately or simultaneously control heating based on a heating temperature of the heating unit 100 and some components of the heating unit 100 requiring heating. In another example, the control circuit 540 may control a magnitude of an adsorption pressure of the adsorption unit 200 and separately provide a predetermined adsorption pressure to the inside of each vacuum space according to vacuum spaces requiring adsorption. In another example, the control circuit 540 may simultaneously provide a predetermined adsorption pressure to all vacuum spaces. The control circuit 540 may control the air to be adsorbed through an adsorption hole of the adsorption unit 200 in association with an adsorption pump connected with the adsorption hole and sense the control in real time. In another example, the control circuit 540 may control a moving speed and a moving distance of the driving unit 400 by controlling a driving motor connected with the driving unit 400. The control circuit 540 may sense movement of a lift of the driving unit in real time in association with a position sensor and/or a lamp unit of the driving unit 400.

According to various embodiments, parts such as a driving motor, a cooling fan, a position sensor, etc., may be mounted inside the housing 510. The driving motor may provide an operation of the driving unit 400, and the cooling fan may circulate a flow of internal air to the outside to emit heat generated inside the housing 510 to the outside. In another example, the sensor may include a position sensor (e.g., a height sensor of FIG. 4) and a vacuum pressure sensor (e.g., a vacuum pressure sensor of FIG. 4), and the sensor may be electrically connected with the driving unit 400 or the adsorption unit 200 to sense position displacement of the driving unit 400 or a pressure provided to the adsorption unit 200.

According to various embodiments, the data input unit 550 and/or the data output unit 560 may be arranged on an outer surface of the housing 510. The data input unit 550 may employ an input device such as a key pad or a button, and the data output unit 560 may adopt a display unit such as a display device (e.g., a liquid crystal display (LCD) display device).

According to an embodiment, the data output unit 560 may provide operation state information and/or necessary operation information of the separable electronic device 10. The data output unit 560 may be arranged such that at least a part thereof is exposed to the outside of the housing 510, and may be electrically connected with the printed circuit unit (e.g., a control circuit).

According to an embodiment, the data input unit 550 may automatically or manually control operations of the heating unit 100, the adsorption unit 200, the fixing unit 300, and/or the driving unit 400. The data input unit 550 may include a plurality of button units for various functions. A heating button unit may include buttons for heating of the heating unit 100. For example, a pre-heating button, a first heating button (e.g., a heating and/or temperature control button of the upper heating unit 110), and a second heating button (e.g., a heating and/or temperature control button of the lower heating unit 120) for controlling operations of the heating unit 100. According to an embodiment, the button units may include buttons for an adsorption operation of the adsorption unit 200. For example, the button units may include a first adsorption button (e.g., a vacuum pressure operation and/or control button for a vacuum space of a central region), a second adsorption button (e.g., a vacuum pressure operation and/or control button for a vacuum space of a side region with respect to the center), and a third adsorption button (e.g., a vacuum pressure operation and/or control button for a vacuum space of the other side region with respect to the center) for controlling operations of the adsorption unit 200. According to an embodiment, the button units may include a plumb of buttons for upward or downward movement of the driving unit 400. For example, the button units may include a plurality of buttons including a first operation button (e.g., an OCTA mode), a second operation button (e.g., a back glass mode), and a third operation button (e.g., a quick mode) for controlling operations of the driving unit 400.

Hereinbelow, structures of the heating unit 100, the adsorption unit 200, the fixing unit 300, and/or the driving unit 400 will be described in detail.

Figure 5:
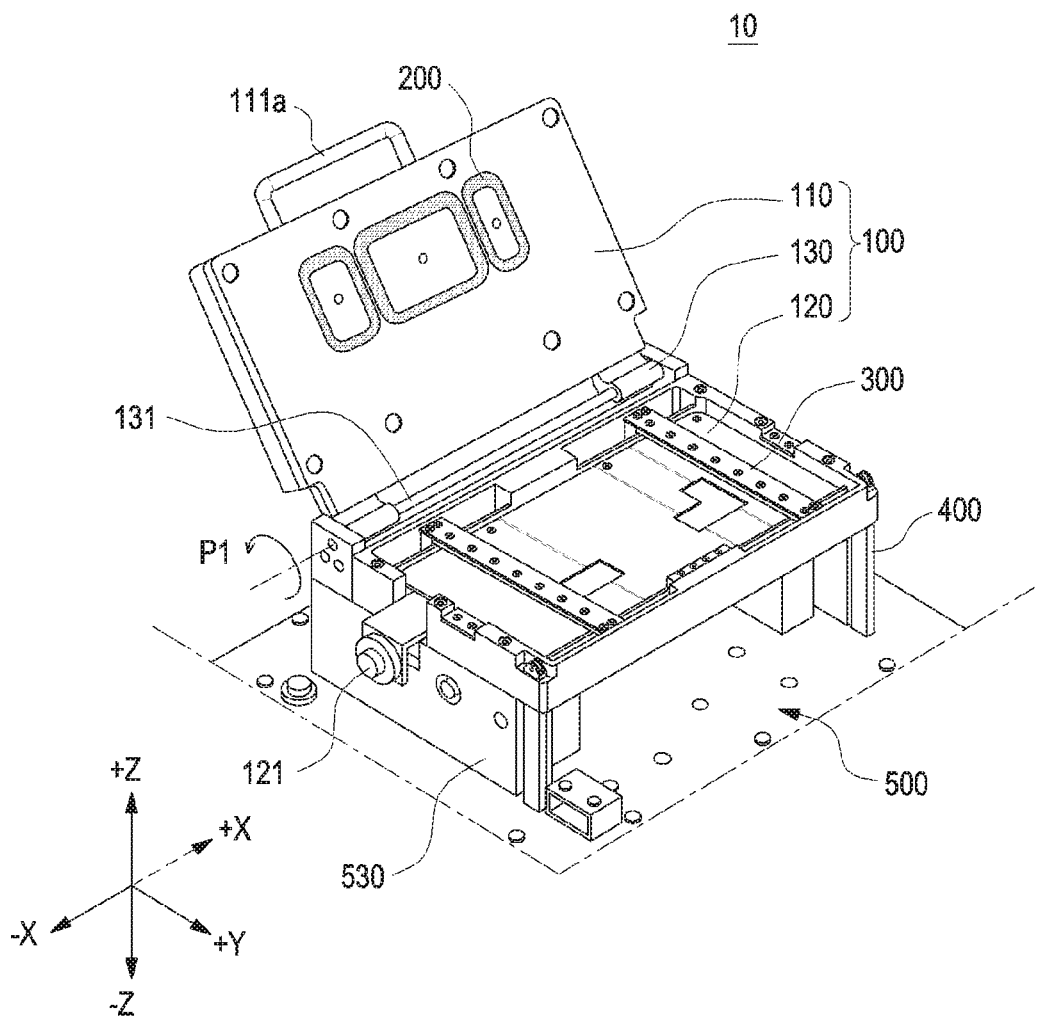
FIG. 5 is a perspective view of an open state of a separable electronic device 10 in which an upper heating unit 110 rotates with respect to a lower heating unit 120, according to various embodiments of the present disclosure.
Figure 6:
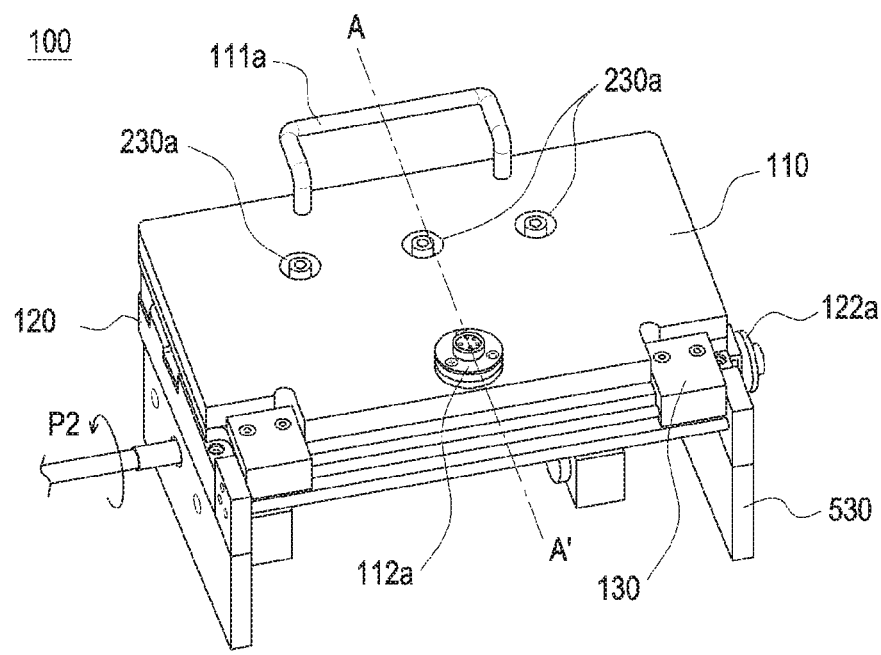
FIG. 6 is a perspective view of a closed state of a heating unit 100 in which an upper heating unit 110 and a lower heating unit 120 face each other, according to various embodiments of the present disclosure.

FIG. 5 is a perspective view of an open state of the separable electronic device 10 in which the upper heating unit 110 rotates with respect to the lower heating unit 120, according to various embodiments of the present disclosure. FIG. 6 is a perspective view of a closed state of the heating unit 100 in which the upper heating unit 110 and the lower heating unit 120 face each other, according to various embodiments of the present disclosure.

Figure 7:
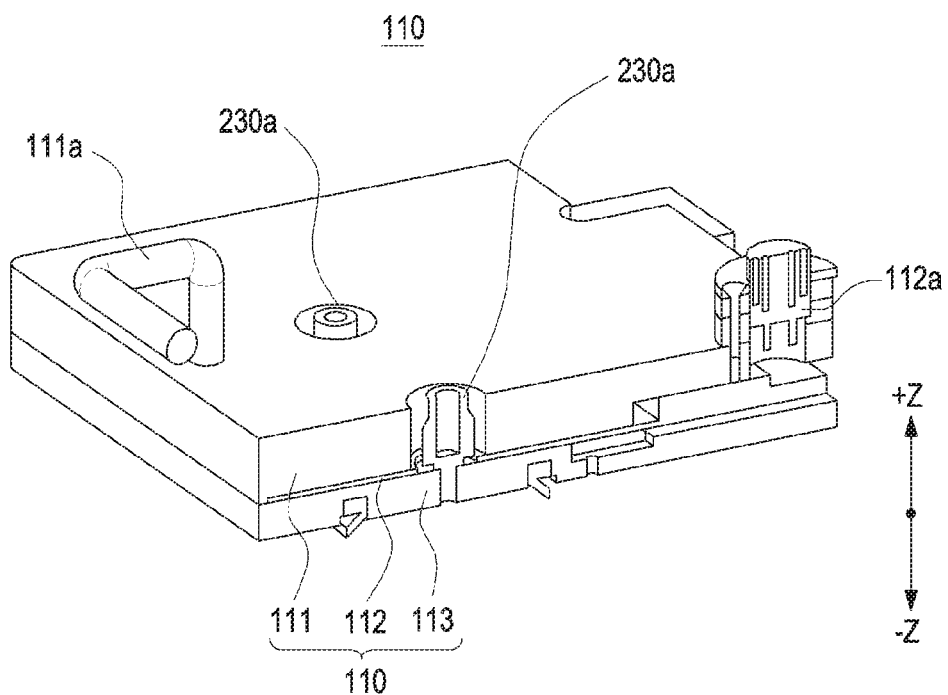
FIG. 7 is a cross-sectional view cut along a line A-A' of FIG. 6 according to various embodiments of the present disclosure.
Figure 8:
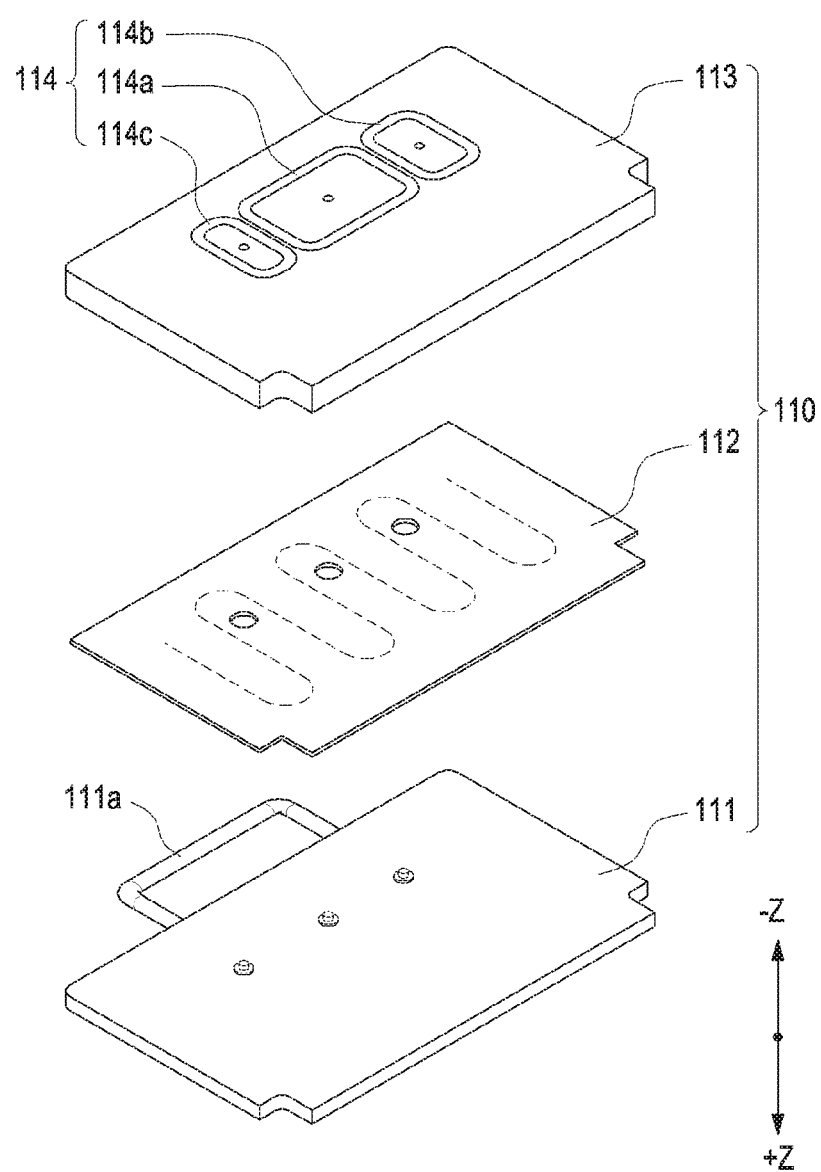
FIG. 8 is a perspective view of a stacked structure of an upper heating unit 110 according to various embodiments of the present disclosure.

FIG. 7 is a cross-sectional view cut along a line A-A' of FIG. 6 according to various embodiments of the present disclosure. FIG. 8 is a perspective view of a stacked structure of the upper heating unit 110 according to various embodiments of the present disclosure.

According to various embodiments, the separable electronic device 10 may include the heating unit 100, the adsorption unit 200 mounted on a side of the heating unit 100, the fixing unit 300 formed to surround at least a part of the heating unit 100, the driving unit 400 moving at least a part of the heating unit 100, and a main body part (not shown) including a control circuit for controlling heating and the amount of heating of the heating unit 100, The structure of the heating unit 100 shown in FIGS. 5 through 8 may be entirely or partially the same as the structure of the heating unit 100 shown in FIGS. 1 through 4.

In FIGS. 5 through 8, in a three-axis orthogonal coordinate system, 'X' may denote the length direction of the separable electronic device 10, 'Y' may denote the width direction of the separable electronic device 10, and 'Z' may denote the thickness direction of the separable electronic device 10. In an embodiment of the present disclosure, 'Z' may mean the first direction+Z and the second direction−Z, 'Y' may mean the third direction+Y and the fourth direction-Y, and 'X' may mean the fifth direction+X and the sixth direction-X.

Referring to FIGS. 5 through 8, the heating unit 100 may include the upper heating unit 110, the lower heating unit 120, and a connection module 130 coupling the upper heating unit 110 with the lower heating unit 120 such that the upper heating unit 110 may rotate with respect to the lower heating unit 120. The connection module 130 may include a hinge structure including a rotational shaft 131, and the heating unit 110 may rotate with respect to the lower heating unit 120 along the rotational shaft 131 to open or close at least a part of the separable electronic device 10.

According to various embodiments, when the separable electronic device 10 is open through rotation of the upper heating unit 110 in a direction P1 (e.g., a counterclockwise direction), a surface of the lower heating unit 120 may be exposed to outside. The external electronic device 20 (e.g., a mobile device) for separation or disassembling may be placed on a surface of the lower heating unit 120. After the external electronic device 20 (e.g., a mobile device) is placed on the surface, the separable electronic device 10 may be closed through rotation of the upper heating unit 110 in a direction P2 (e.g., a clockwise direction) that is opposite to the direction P1. The external electronic device 20 (e.g., a mobile device) may receive heat in a state where a front surface thereof opposes the upper heating unit 110 and a rear surface thereof opposes the lower heating unit 120. In another example, the external electronic device 20 (e.g., a mobile device) may receive heat in a state where the front surface thereof opposes the lower heating unit 120 and the rear surface thereof opposes the upper heating unit 110.

According to various embodiments, the upper heating unit 110 may include a first heater member 112 in which a heating wire is arranged, a first plate 111 arranged in the first direction+Z of the first heater member 112, and a first base 113 arranged in the second direction-Z of the first heater member 112. For example, the first heater member 112 and the first base 113 may be stacked in the second direction-Z from the first plate 111.

According to an embodiment, the heating wire may be arranged inside the first heater member 112, and the first heater member 112 may include an insulation material (e.g., silicon) formed to surround at least a part of the heating wire. The first heater member 112 may be provided in an area corresponding to the first plate 111 and the first base 113, and may be electrically connected with a heater connector 112a arranged on an outer surface of the first plate 111. The heater connector 112a may be coupled with a heater line connected with a main body part 500, and may be provided with necessary power through a control operation of a control circuit (e.g., the control circuit 540 of FIG. 4) of the main body part 500.

According to an embodiment, the first plate 111 may include a handle 111a mounted on a surface such that the user opens or closes the separable electronic device 10, a heater connector 112a, and at least one vacuum connector 230a arranged adjacent to the heater connector 112a. The handle 111a may be formed on an end portion of an outer surface of the first plate 111 in such a way to be easily used by the user, and the heater connector 112a and a vacuum connector 230a may be arranged on a region of the outer surface of the first plate 111 in such a way to be coupled with a heater line and a vacuum line connected from the main body part 500. The heater connector 112a may be electrically connected with the heating wire of the first heater member 112, and the vacuum connector 230a may be connected with an adsorption hole 230 of the adsorption unit 200 to be described later.

According to an embodiment, the first base 113 may include a high-conductivity material (e.g., aluminum) such that heat generated in the first heater member 112 may be delivered to an external electronic device arranged inside the separable electronic device 10. The outer surface of the first base 113 may be globally formed as a heat-emitting surface, and include in a part thereof, at least one recess 114 where at least a part of the adsorption unit 200 may be arranged.

According to an embodiment, the recess 114 may be formed to correspond to the number of adsorption members 210 of the adsorption unit 200. For example, the recess 114 may be provided in plural, and may be provided as a groove in the form of a closed line in the outer surface of the first base 113. The groove in the form of a closed line may have a square shape with a rounded corner. In another example, the recess 114 may include a first recess 114a formed in a central portion of the first base 113, and a second recess 114b and a third recess 114c arranged spaced apart from each other with the first recess 114a therebetween. The first recess 114a, the second recess 114b, and the third recess 114c may be formed to different sizes. For example, the length of a line formed by the first recess 114a may be longest and the length of a formed line may be reduced in an order of the second recess 114b and then the third recess 114c. According to the size of the recess 114, the adsorption unit 200 with a size corresponding to the recess 114 may be arranged in the recess 114, and may adsorb a substantial front surface of the external electronic device 20 with various sizes. However, the number and shape of the recesses 114 are not limited to those examples, and may be design-changed into various numbers and shapes such as a number equal to or greater than 4 and/or a circular shape.

According to an embodiment, at least one separation groove 115 may be formed in a region of the upper heating unit 110 to assist separation of the heating-completed external electronic device. For example, the at least one separation groove 115 may be formed to be exposed through the first base 113, and may be arranged adjacent to the adsorption hole 230. The at least one separation groove 115 may have a circular shape and a diameter of about 1 mm. The at least one separation groove 115 may rapidly decompress a pressure of the vacuum space to release adsorption, such that the cover separated from the external electronic device may be easily separated and damage prevention may be facilitated.

According to various embodiments, the upper heating unit 110 may be heated through control of a temperature simultaneously with or separately from the lower heating unit 120. For example, a switch formed on an outer surface of the main body part 500 may include a pre-heating button (e.g., a pre-heating button), a first heating button (e.g., a heater upper button), and a second heating button (e.g., a heater lower button). The pre-heating button may set a step of pre-heating to a predetermined default temperature to reduce a time required for a lead time before the upper heating unit 110 is heated. Thereafter, through a present heating operation (e.g., pressing of the first heating button), the upper heating unit 110 may be heated to about 60-80. In another example, through a heating operation (e.g., pressing of the first heating button), the upper heating unit 110 may be heated to about 70. According to an embodiment, the upper heating unit 110 operates, such that a time for heating the external electronic device may be about 3 minutes-7 minutes. In another example, a time for heating the upper heating unit 110 may be about 5 minutes.

Figure 9:
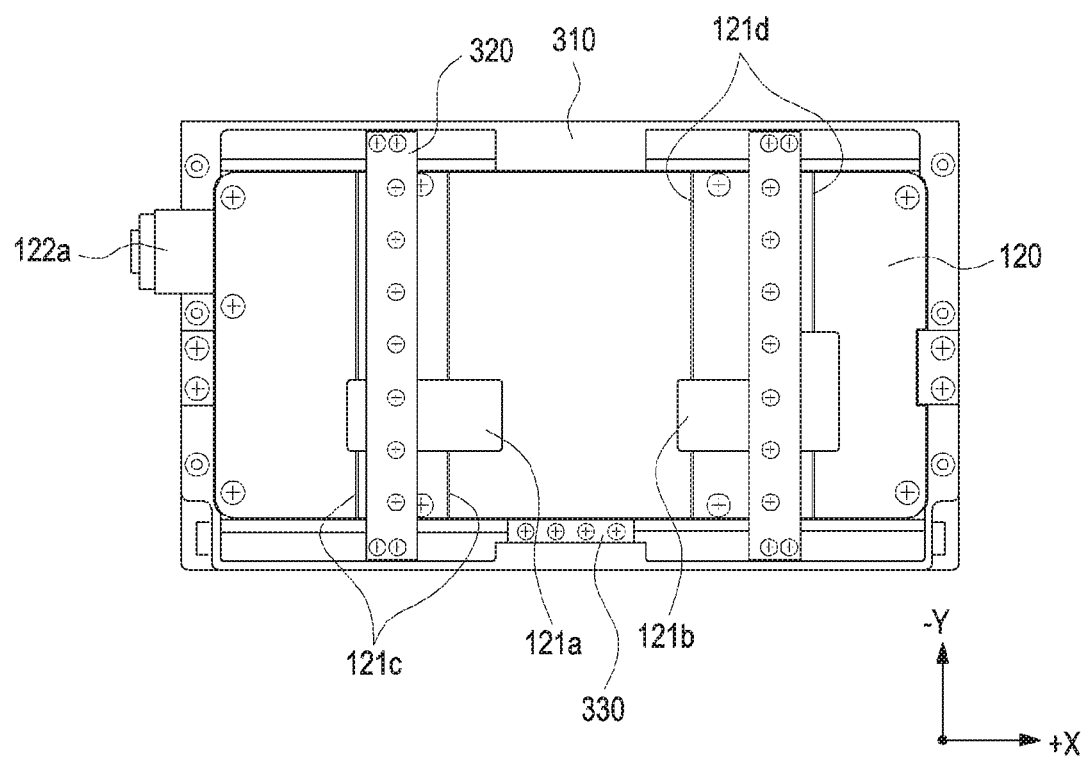
FIG. 9 is a perspective view of a front surface of an upper heating unit 120 according to various embodiments of the present disclosure.
Figure 10:
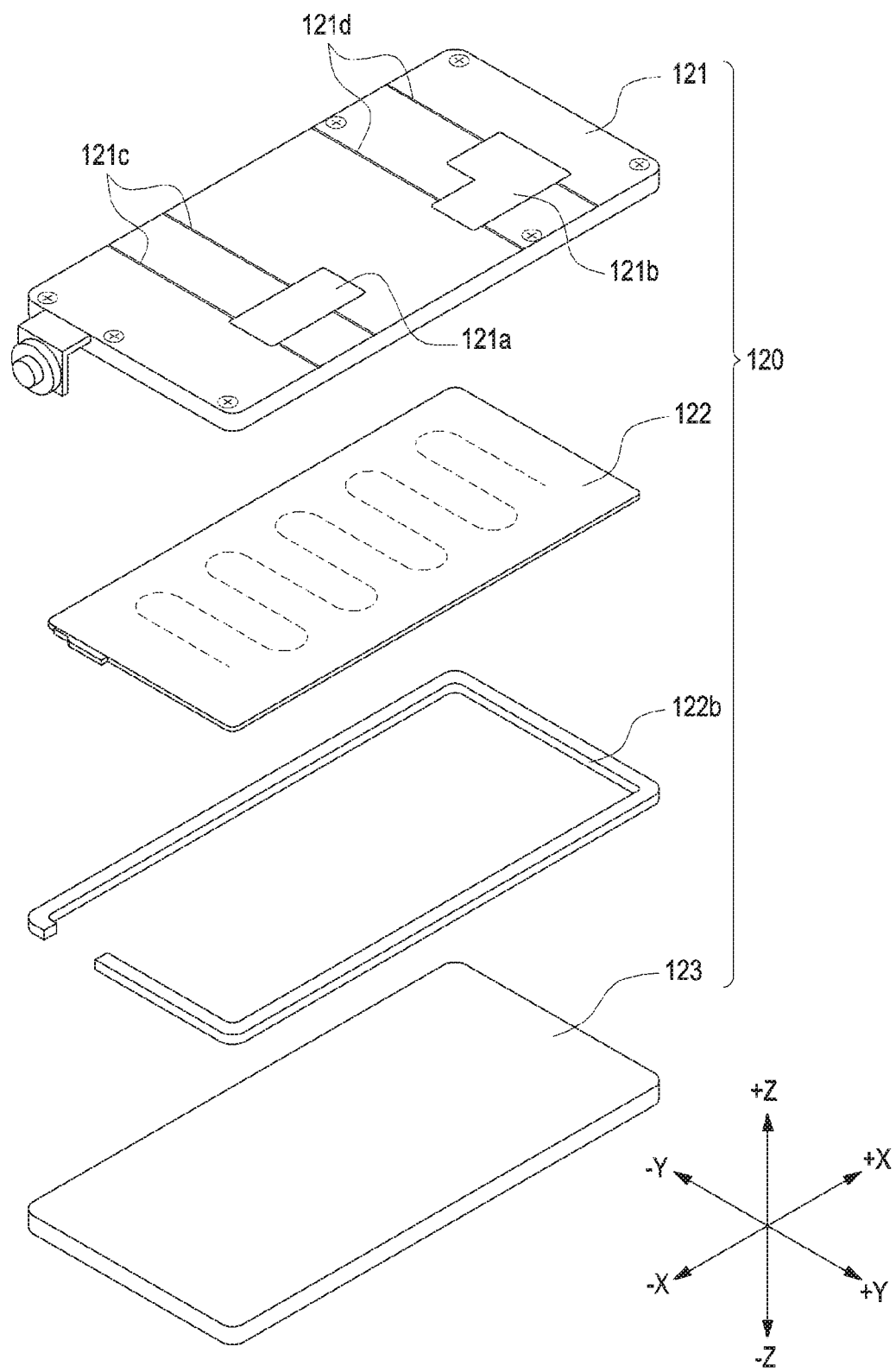
FIG. 10 is a perspective view of a stacked structure of a lower heating unit 120 according to various embodiments of the present disclosure.

FIG. 9 is a perspective view of a front surface of an upper heating unit 120 according to various embodiments of the present disclosure. FIG. 10 is a perspective view of a stacked structure of a lower heating unit 120 according to various embodiments of the present disclosure.

In FIGS. 9 through 10, in a three-axis orthogonal coordinate system, 'X' may denote the length direction of the separable electronic device 10, 'Y' may denote the width direction of the separable electronic device 10, and 'Z' may denote the thickness direction of the separable electronic device 10. In an embodiment of the present disclosure, 'Z' may mean the first direction+Z and the second direction−Z, 'Y' may mean the third direction+Y and the fourth direction−Y, and 'X' may mean the fifth direction+X and the sixth direction−X.

Referring to FIGS. 5, 6, and 10, the heating unit 100 may include the upper heating unit 110, the lower heating unit 120, and the connection module 130 coupling the lower heating unit 120 with the upper heating unit 110 such that the upper heating unit 110 may rotate with respect to the upper heating unit 120. The connection module 130 may include a hinge structure including a rotational shaft 131, and the heating unit 110 may rotate with respect to the lower heating unit 120 along the rotational shaft 131 to open or close at least a part of the separable electronic device 10.

According to various embodiments, when the lower heating unit 120 is open through rotation of the upper heating unit 110 in the direction P1 (e.g., the counterclockwise direction), the lower heating unit 120 is provided such that a surface thereof is exposed and the external electronic device (e.g., a mobile device) for disassembly may be placed. After the external electronic device 20 (e.g., a mobile device) is placed on the surface of the lower heating unit 120, the separable electronic device 10 may be closed through rotation of the upper heating unit 110 in the direction P2 (e.g., the clockwise direction) that is opposite to the direction P1. The external electronic device 20 (e.g., a mobile device) may receive heat in a state where the front surface thereof opposes the upper heating unit 110 and the rear surface thereof opposes the lower heating unit 120. In another example, the external electronic device 20 (e.g., a mobile device) may receive heat in a state where the front surface thereof opposes the lower heating unit 120 and the rear surface thereof opposes the upper heating unit 110.

According to various embodiments, the lower heating unit 120 may include a second heater member 122 in which a heating wire is arranged, a second plate 121 arranged in the first direction+Z of the second heater member 122, and a second base 123 arranged in the second direction−Z of the second heater member 122. For example, the second heater member 122 and the second plate 123 may be stacked in the second direction−Z from the second base 121.

According to an embodiment, the heating wire may be arranged inside the second heater member 122, and the second heater member 122 may include an insulation material (e.g., silicon) formed to surround at least a part of the heating wire. The second heater member 122 may be provided in an area corresponding to the second plate 123 and the second base 121, and may be electrically connected with a heater connector 122a arranged on a side surface of the second plate 123 and/or the second base 121. The heater connector 122a may be coupled with a heater line connected with a main body part 500, and may be provided with necessary power through a control operation of the control circuit 540 of the main body part 500.

According to an embodiment, a sealing member 122b may be arranged to surround at least a part of the second heater member 122. The sealing member 122b may protect a heating wire formed therein and suppress heat to be emitted to outside, while surrounding an edge of the second heater member.

According to an embodiment, the second base 121 may include a high-conductivity material (e.g., aluminum) such that heat generated in the second heater member 122 may be delivered to an external electronic device arranged inside the separable electronic device 10. The outer surface of the second base 121 may be globally formed as a heat-emitting surface.

According to an embodiment, the second base 121, as a surface on which the external electronic device is placed, may include grooves 121a and 121b formed inward on at least a part of the second base 121. The grooves 121a and 121b may be formed in plural and formed to have different sizes. For example, the grooves 121a and 121b may include a first groove 121a and a second groove 121b arranged spaced apart from the first groove 121a. The first groove 121a may be a groove in the shape of a rectangle, and the second groove 121b may be a groove in the shape of '⊓' or '⌐', at least a part thereof is bent. The first groove 121a and the second groove 121b may secure a space inside the second base 121 to protect a protruding portion (e.g., a camera) of the external electronic device, placed on the second base 121, from being damaged. However, the number and shape of the grooves 121a and 121b are not limited to those examples, and may be design-changed into various numbers and shapes such as a number equal to or greater than 3 and/or a circular shape.

According to an embodiment, the second base 121, as the surface on which the external electronic device is placed, may include extension lines 121c and 121d such that the external electronic device may be accurately placed. The extension lines 121c and 121d may be formed in plural along a widthwise direction (e.g., the third direction+Y or the fourth direction−Y) of the second base 121, in which each of the extension lines 121c and 121d may be formed to coincide with virtual lines extending in the longitudinal directions of the adsorption member 210 arranged on the upper heating unit 110 and/or the recess 114 formed in the upper heating unit 110. For example, the first extension line 121c may be formed to coincide with a virtual line extending from a line in the longitudinal direction of the third recess 113 and the third recess 114c and the first recess 114a. The first extension line 121c may be provided in plural. In another example, the second extension line 121d may be formed to coincide with a virtual line extending from a line in the longitudinal direction of the first recess 114a and the second recess 114c and the first recess 114a of the upper heating unit 110. The second extension line 121d may be provided in plural.

According to an embodiment, the extension lines 121c and 121d may be formed to overlap with partial regions of the first groove 121a and the second groove 121b formed in the second base 121c of the lower heating unit 120. As the extension lines 121c and 121d are formed, the external electronic device 20 is placed such that an upper or lower side surface thereof coincides with the extension line, thus wholly providing heat generated in the heating unit 100. However, the number and shape of the extension lines 121a and 121d are not limited to those examples, and may be design-changed into various numbers and shapes.

According to an embodiment, the second plate 123 may support the second base 121 and the second heater member 122, and may be coupled with the support member 530 of the main body part 500 arranged thereunder. The support member 530, as a frame formed on an outer surface of the housing of the main body part 500, can stably support the heating unit 100. A plurality of poles for operating the fixing unit 300 are arranged inward from the support member 530, and the support member 530 may protect the plurality of poles.

According to various embodiments, the lower heating unit 120 may be heated through control of a temperature simultaneously with or separately from the upper heating unit 110. For example, a switch formed on an outer surface of the main body part 500 may include a pre-heating button (e.g., a pre-heating button), a first heating button (e.g., a heater upper button), and a second heating button (e.g., a heater lower button). The pre-heating button may set a step of pre-heating to a predetermined default temperature to reduce a time required for a lead time before the lower heating unit 120 is heated. A default temperature for the pre-heating may be about 65-75 for the upper heating unit 110 and about 55-65 for the lower heating unit 120. In another example, the default temperature for the pre-heating may be about 75 degrees for the upper heating unit 110 and about 65 degrees for the lower heating unit 120.

Thereafter, through a present heating operation (e.g., pressing of the second heating button), the lower heating unit 120 may be heated to about 60-80. In another example, through a heating operation (e.g., pressing of the second heating button), the upper heating unit 110 may be heated to about 70. According to an embodiment, the lower heating unit 120 operates, such that a time for heating the external electronic device may be about 3 minutes-7 minutes. In another example, a time for heating the lower heating unit 120 may be about 5 minutes.

Figure 11:
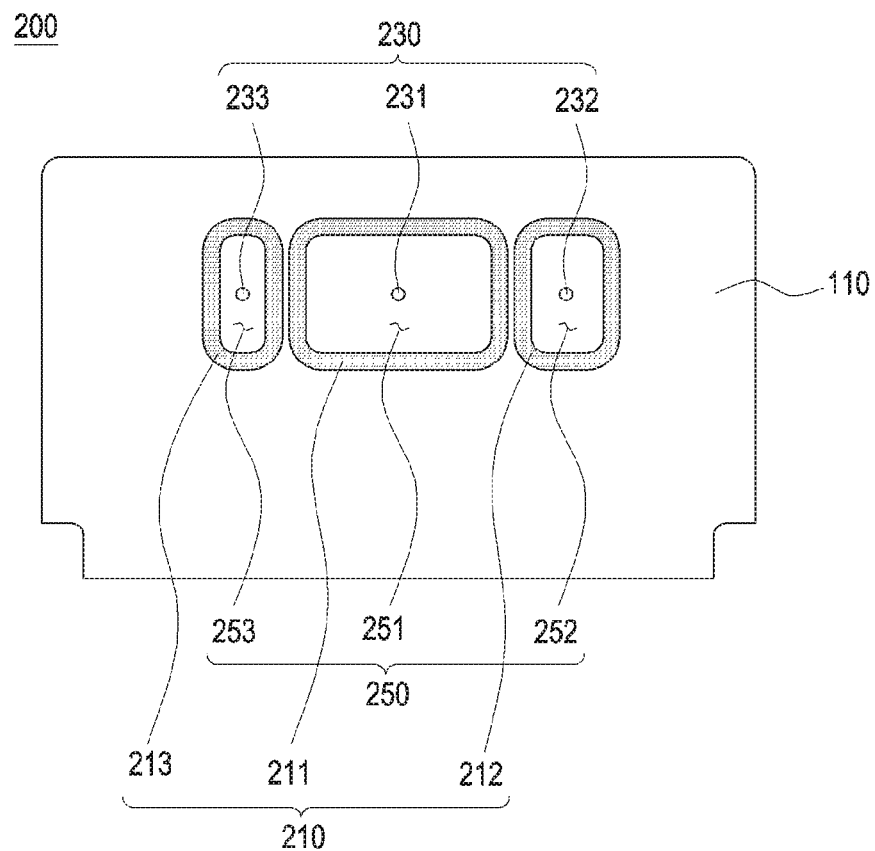
FIG. 11 illustrates a surface of an adsorption unit 200 according to various embodiments of the present disclosure.
Figure 12:
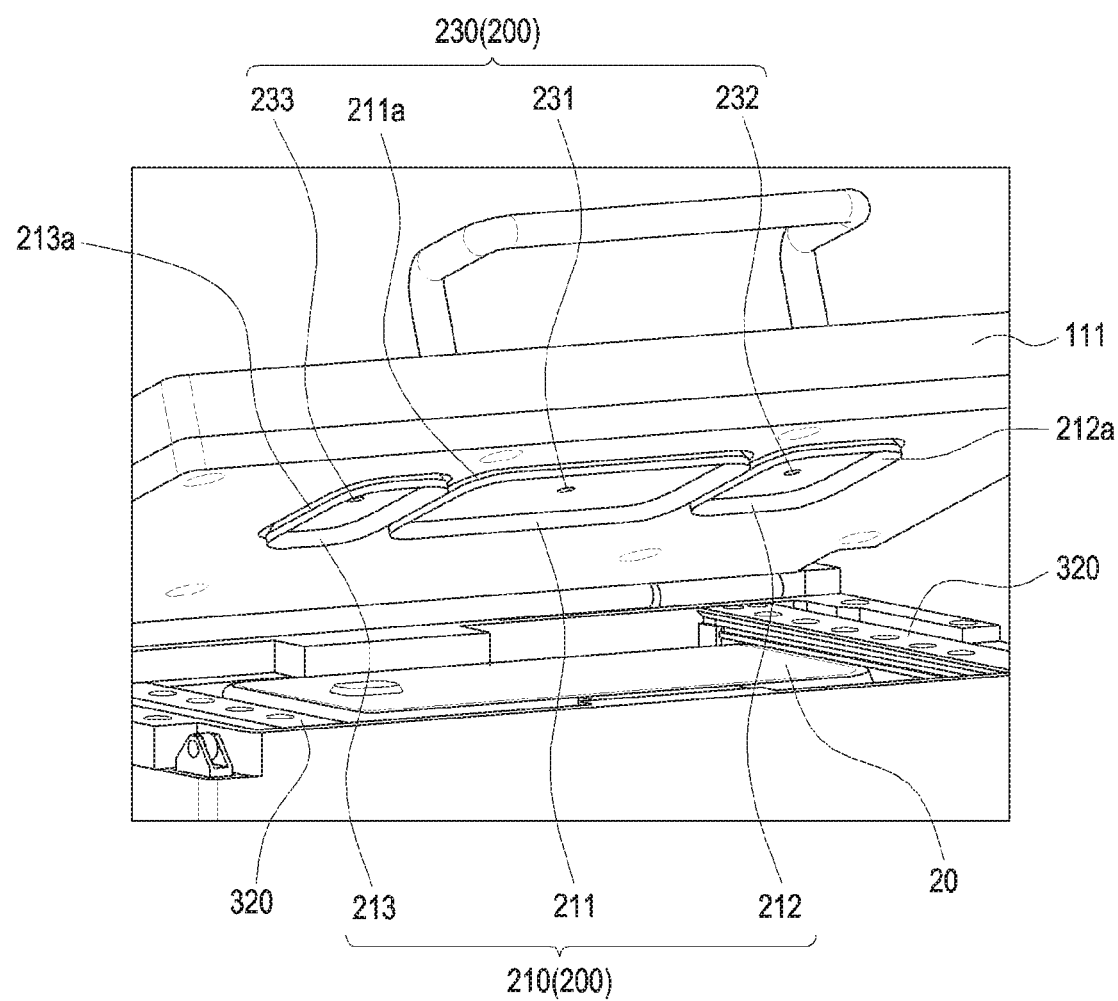
FIG. 12 is a perspective view showing an arrangement relationship between an external electronic device 20 settled on a lower heating unit 120 and an adsorption portion 200, according to various embodiments of the present disclosure.
Figure 13:
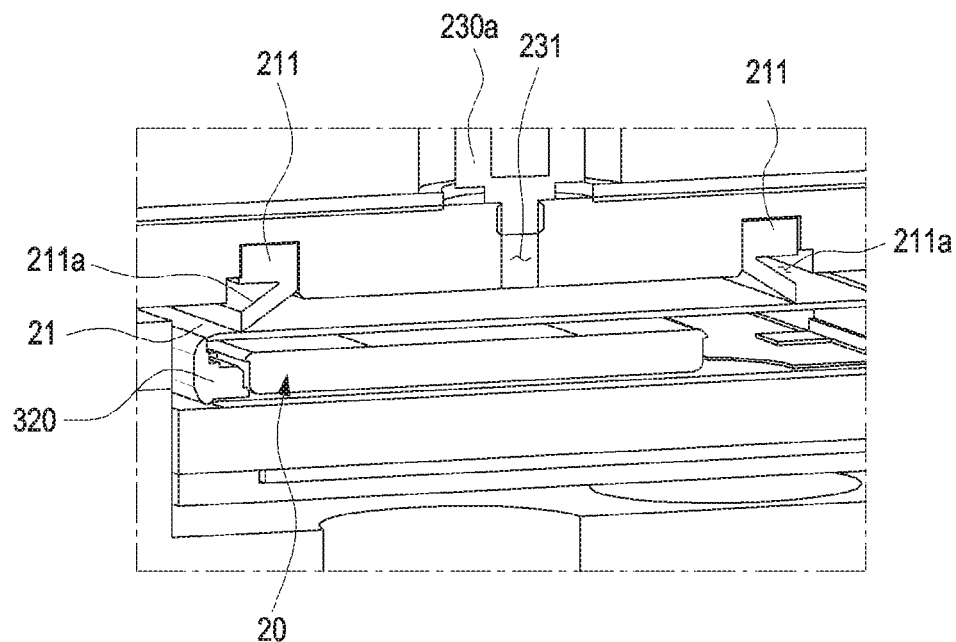
FIG. 13 is a cross-sectional view showing a state before an adsorption member 210 contacts an external electronic device 20, according to various embodiments of the present disclosure.
Figure 14:
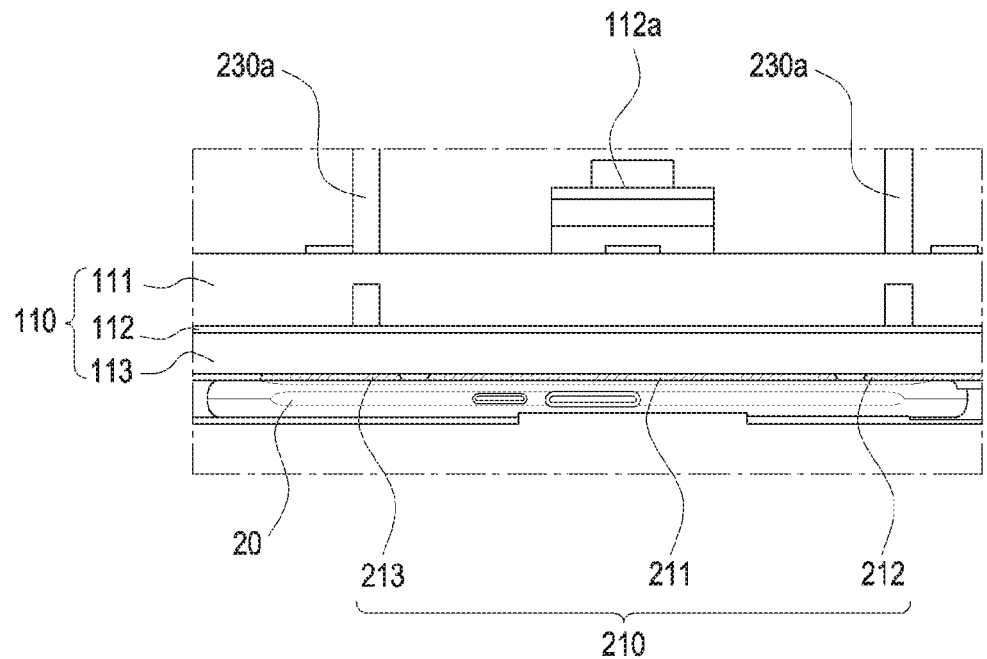
FIG. 14 is a cross-sectional view showing a state in which an adsorption member 210 contacts an external electronic device 20, according to various embodiments of the present disclosure.

FIG. 11 illustrates a surface of the adsorption unit 200 according to various embodiments of the present disclosure. FIG. 12 is a perspective view showing an arrangement relationship between the external electronic device 20 settled on the lower heating unit 120 and the adsorption portion 200, according to various embodiments of the present disclosure. FIG. 13 is a cross-sectional view showing a state before the adsorption member 210 contacts the external electronic device 20, according to various embodiments of the present disclosure. FIG. 14 is a cross-sectional view showing a state in which the adsorption member 210 contacts the external electronic device 20, according to various embodiments of the present disclosure.

According to various embodiments, the separable electronic device 10 may include the adsorption unit 200, the heating unit 200 providing an accommodating space for at least a part of the adsorption unit 100, the fixing unit 300 formed adjacent to the adsorption unit 200, the driving unit 400 moving at least a part of the adsorption unit 200, and the main body part 500 including a control circuit for controlling the adsorption unit 200. The adsorption unit 200 shown in FIGS. 11 through 14 may be entirely or partially the same as the adsorption unit 200 shown in FIGS. 1 through 4.

Referring to FIGS. 5 and 11 through 14, the adsorption unit 200 may include a plurality of adsorption members 210 and a plurality of adsorption holes 230 arranged adjacent to the plurality of adsorption members 210. According to various embodiments, a recess (e.g., the recess 114 of FIG. 8) in the form of a closed curve may be formed on a surface of the upper heating unit 110, and the adsorption member 210 of the adsorption unit 200 may be attachably/detachably arranged on the recess 114.

According to an embodiment, the adsorption member 210 may be formed to correspond to the number of recesses 114 of the upper heating unit 110. For example, the adsorption member 210 may be provided in plural, and may include a first adsorption member 211 formed in the central region of the upper heating unit 110 and a second adsorption member 212 and a third adsorption member 213 that are arranged spaced apart from the first adsorption member 211.

According to an embodiment, the adsorption member 210 may be provided in the form of a closed line. The closed line may form a square shape with a rounded corner. In another example, the first adsorption member 211, the second adsorption member 212, and the third adsorption member 213 may be formed to different sizes. For example, the length of a line formed by the first adsorption member 211 may be longest and the length of a formed line may be reduced in an order of the second adsorption member 212 and then the third adsorption member 213. According to the size of the adsorption member 210, a vacuum space formed on the surface of the external electronic device 20 may be provided differently.

According to an embodiment, a length of the adsorption member 210 except for a round portion of the first adsorption member 211 may be about 60 mm-70 mm and a width thereof may be about 40 mm-45 mm. In another example, the length of the adsorption member 210 except for the round portion of the first adsorption member 211 may be about 66.2 mm and the width thereof may be about 43.1 mm. According to an embodiment, a length of the adsorption member 210 except for a round portion of the second adsorption member 212 may be about 20 mm-30 mm and a width thereof may be about 40 mm-45 mm. In another example, the length of the adsorption member 210 except for the round portion of the second adsorption member 212 may be about 26.2 mm and the width thereof may be about 43.1 mm. According to an embodiment, a length of the adsorption member 210 except for a round portion of the third adsorption member 213 may be about 15 mm-20 mm and a width thereof may be about 40 mm-45 mm. In another example, the length of the adsorption member 210 except for the round portion of the third adsorption member 213 may be about 17.6 mm and the width thereof may be about 43.1 mm. However, the number and shape of the adsorption member 210 are not limited to those examples, and may be design-changed into various numbers and shapes such as a number equal to or greater than 4 and/or a circular shape.

According to an embodiment, the first adsorption member 211 may be manufactured in the form of a closed line, and at least a part thereof may be inserted into a recess (e.g., the recess 114 of FIG. 8) formed in the upper heating unit 110 for coupling with the upper heating unit 110. Another part of the first adsorption member 211 may protrude to the outside of the recess (e.g., the recess 114 of FIG. 8) to from a first vacuum space 251 surrounded by a region of the upper heating unit 110 and a region of the external electronic device 20.

According to an embodiment, the first adsorption member 211 may form the closed first vacuum space 251 surrounded by the upper heating unit 110 and at least a part of the external electronic device 20. An outer circumferential surface of the first adsorption member 211 may include a step 211a inclined from the exterior toward the center. The step 211a may be formed along an edge line of the first adsorption member 211, and may be deformed by opening or closing of the upper heating unit 110 to reinforce the degree of vacuum of the first vacuum space 251. For example, the inclined step 211a of the first adsorption member 211 may be provided in an outwardly open '<' or '>' shape. When the upper heating unit 110 operates from an open state to a closed state, the inclined step 211a may be variable such than an open portion is folded. The folded step portion may disconnect an inner space and an outer space of the first adsorption member 211 with each other while sealing a surface 21 of the external electronic device 20. The first adsorption member 211 may be manufactured to include an elastic material capable of restricting introduction of external air to the vacuum space, such as rubber, silicon, etc.

According to an embodiment of the disclosure, the second adsorption member 212 may provide a second vacuum space 252 with an area that is smaller than that of the first adsorption member 211. For example, the closed second vacuum space 252 formed by surrounding the second adsorption member 212 by the upper heating unit 110 and at least a part of the external electronic device 20 may have a smaller volume than the first vacuum space 251. According to an embodiment, the third adsorption member 213 may provide a third vacuum space 253 with an area that is smaller than those of the first and second adsorption members 211 and 212. For example, the closed third vacuum space 253 formed by surrounding the third adsorption member 213 by the upper heating unit 110 and at least a part of the external electronic device 20 may have a smaller volume than the first and second vacuum spaces 251 and 252.

According to an embodiment, outer circumferential surfaces of the second adsorption member 212 and the third adsorption member 213 may include steps 213a, inclined from the exterior toward the center. The steps 212a and 213a may be formed along edge lines of the second adsorption member 212 and the third adsorption member 213, and may be deformed by opening or closing of the upper heating unit 110 to reinforce the degrees of vacuum of the second vacuum space 252 and the third vacuum space 253. For example, the inclined steps 212a, and 213a of the second adsorption member 212 and the third adsorption member 213 may be provided in an outwardly open '<' or '>' shape. When the upper heating unit 110 operates from an open state to a closed state, the inclined steps 212a and 213a may be variable such than an open portion is folded. The folded step portion may disconnect inner spaces and outer spaces of the second adsorption member 212 and the third adsorption member 213 with one another while sealing a surface of the external electronic device. The second adsorption member 212 and the third adsorption member 213 may be manufactured to include an elastic material capable of restricting introduction of an external air to the second vacuum space 252 and the third vacuum space 253, such as rubber, silicon, etc.

According to various embodiments, the adsorption member 210 may be separated from or coupled with a recess of the heating unit 100. For example, the adsorption member 210 may be easily separated and treated for washing, and when a portion of the adsorption member 210 is abraded, the absorption member 210 may be easily replaced with a new adsorption member, thus being useful for repair and maintenance of the electronic device.

According to various embodiments, the plurality of adsorption units 200 may be formed in plural to correspond to the number of spaces formed by the plurality of adsorption members 210, and may include the adsorption hole 230 that provides a vacuum space by sucking the air. For example, the adsorption hole 230 may include a first adsorption hole 231, a second adsorption hole 232, and a third adsorption hole 233.

According to an embodiment, at least a part of the first adsorption hole 231 may be arranged to be surrounded by the first adsorption member 211, and may be formed to pass through the upper heating unit 110. For example, the first adsorption hole 231 may be connected with the vacuum connector 230a formed in the first plate 111 through the first base, the first heater member, and the first plate of the upper heating unit 110. The first adsorption hole 231 may form a space surrounded by the first adsorption member 211 in a vacuum state through a vacuum line connected with the vacuum connector 230a.

According to an embodiment, at least a part of the second and third adsorption holes 232 and 233 may be arranged to be surrounded by the second and third adsorption members 212 and 213, and may be formed to pass through the upper heating unit 110. For example, the second and third adsorption holes 232 and 233 may be connected with the vacuum connector 230a formed in the first plate 111 through the first base 113, the first heater member 112, and the first plate 111 of the upper heating unit 110. The second and third adsorption units 232 and 233 may form a space surrounded by the second and third adsorption members 212 and 213 in a vacuum state through the vacuum line connected with the vacuum connector 230a.

According to various embodiments, the first, second, and third vacuum spaces 251, 252, and 253 may maintain a vacuum state at all times during operations of the separable electronic device 10. The vacuum line may be connected with the main body part 500, and the control circuit 540 of the main body part 500 may control a constant vacuum state to be maintained simultaneously with or separately from heating.

According to various embodiments, the first adsorption member 211, the second adsorption member 212, and the third adsorption member 213 may variously match for adsorption according to the size of the external electronic device. According to an embodiment, when a surface of the external electronic device 20 corresponding to the size of the first adsorption member 211 is separated, only a first adsorption unit including the first adsorption member 211 and the first adsorption hole 231 may operate. For example, when a rear cover (e.g., back glass) of the external electronic device is separated, only the first adsorption member 211 and the first adsorption hole 231 may operate.

According to an embodiment, when the surface of the external electronic device 20 corresponding to the size of the first adsorption member 211 and the second adsorption member 212 is separated, only the first adsorption unit including the first adsorption member 211 and the first adsorption hole 231 and a second adsorption unit including the second adsorption member 212 and the second adsorption hole 232 may operate. For example, when a front cover or a rear cover (e.g., general OCTA or back glass) of the external electronic device is separated, only the first and second adsorption members 211 and 212 and the first and second adsorption holes 231 and 232 may operate.

According to an embodiment, when the surface of the external electronic device 20 corresponding to the size of the first adsorption member 211 and the third adsorption member 213 is separated, only the first adsorption unit including the first adsorption member 211 and the first adsorption hole 231 and a third adsorption unit including the third adsorption member 213 and the third adsorption hole 233 may operate. For example, when the front cover or the rear cover (e.g., small OCTA or back glass) of the external electronic device is separated, only the first and third adsorption members 211 and 213 and the first and third adsorption holes 231 and 233 may operate.

According to an embodiment, when the surface of the external electronic device 20 corresponding to the size of the first adsorption member 211, the second adsorption member 212, and the third adsorption member 213 is separated, the first adsorption unit including the first adsorption member 211 and the first adsorption hole 231, the second adsorption unit including the second adsorption member 212 and the second adsorption hole 232, and the third adsorption unit including the third adsorption member 213 and the third adsorption hole 233 may operate. For example, when the front cover (e.g., wide OCTA glass) of the external electronic device is separated, the first, second, and third adsorption members 211, 212, and 213 and the first, second, and third adsorption holes 231, 232, and 233 may operate.

According to various embodiments, the first adsorption unit 211 and 231, the second adsorption unit 212 and 232, and the third adsorption unit 213 and 233 may set a vacuum pressure simultaneously or separately. For example, the first adsorption member 211 may operate as a predetermined default pressure. In another example, based on the premise of the operation of the first adsorption member 211, the second adsorption member 212 may operate to form and maintain the first vacuum space 251 and the second vacuum space 252 at the same time. In another example, based on the premise of the operation of the first adsorption member 211, the third adsorption member 213 may operate to form and maintain the first vacuum space 251 and the third vacuum space 253 at the same time. In another example, based on the premise of the operation of the first adsorption member 211, the second and third adsorption members 212 and 213 may operate to form and maintain the first vacuum space 251, the second vacuum space 252, and the third vacuum space 253 at the same time.

According to various embodiments, a vacuum pump for adsorption may be arranged inside the adsorption unit 200 and may operate such that a general pressure of a pump may be maintained as a value of about 40 Kpa or higher. In another example, the vacuum pump may operate such that the general pressure of the pump may be maintained as about 93 Kpa.

According to various embodiments, the adsorption unit may operate in a state where the upper heating unit 110 opposes the lower heating unit 120. For example, a switch formed on an outer surface of the main body part 500 may include a first adsorption button, a second adsorption button, and a third adsorption button, and when one or more of the buttons are pressured, the vacuum pump may operate and the adsorption member may adsorb a surface of the external electronic device to be separated. According to an embodiment, a pressure formed in the vacuum space through the adsorption may be maintained as about 93 Kpa, and the adsorption may be maintained without the operation of the vacuum pump until the pressure decreases to about 40 Kpa or below.

Figure 15:
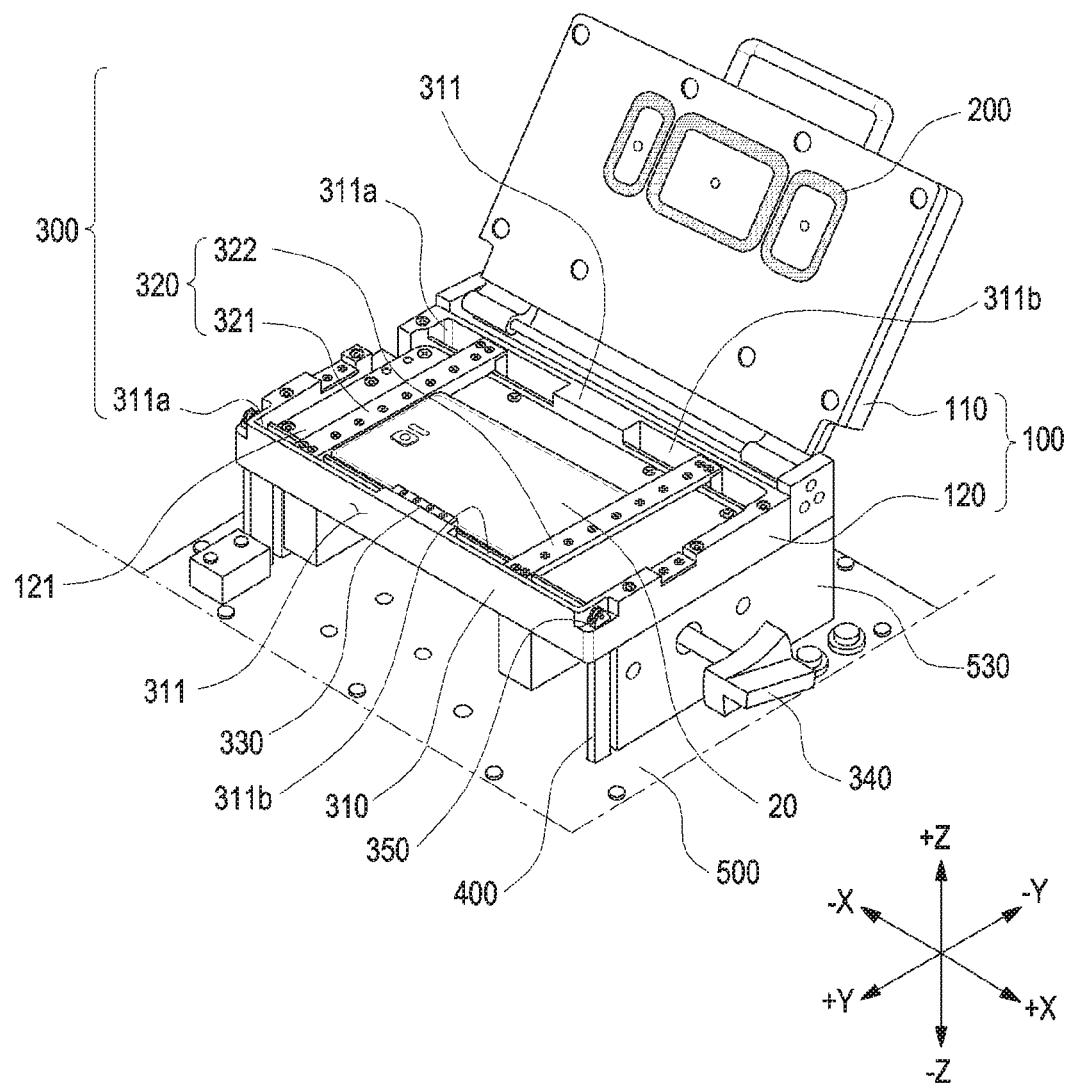
FIG. 15 is a perspective view showing a relationship in which an external electronic device 20 is fixed through a fixing unit 300, according to various embodiments of the present disclosure.
Figure 16:
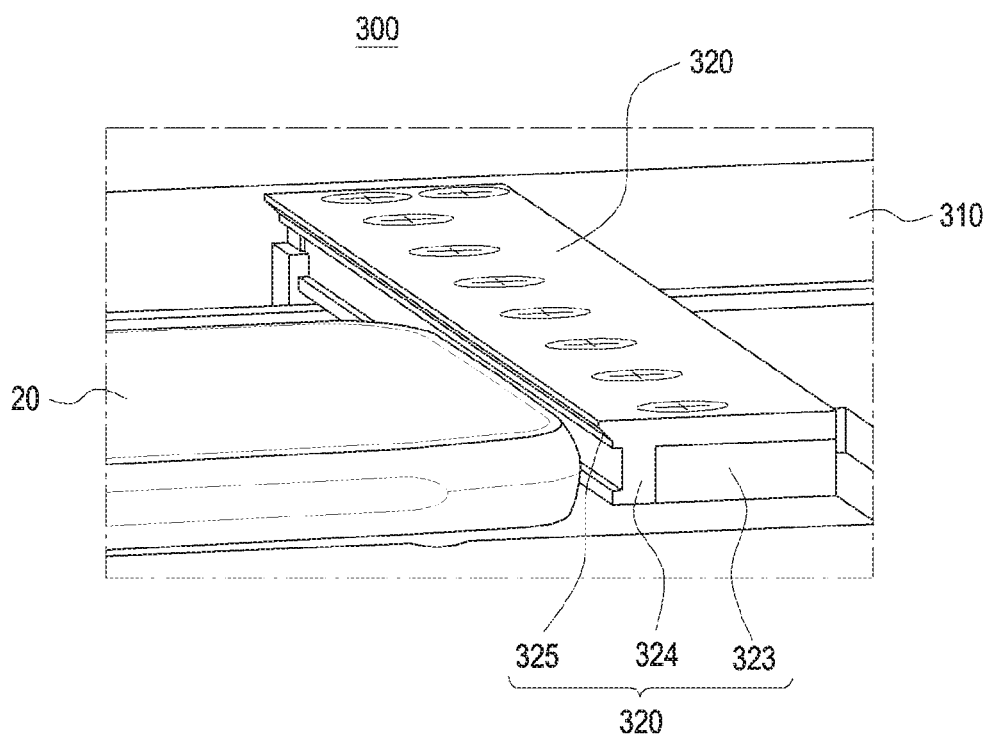
FIG. 16 is a perspective view showing a partial region of a fixing unit 300 contacting an external electronic device 20, according to various embodiments of the present disclosure.
Figure 17:
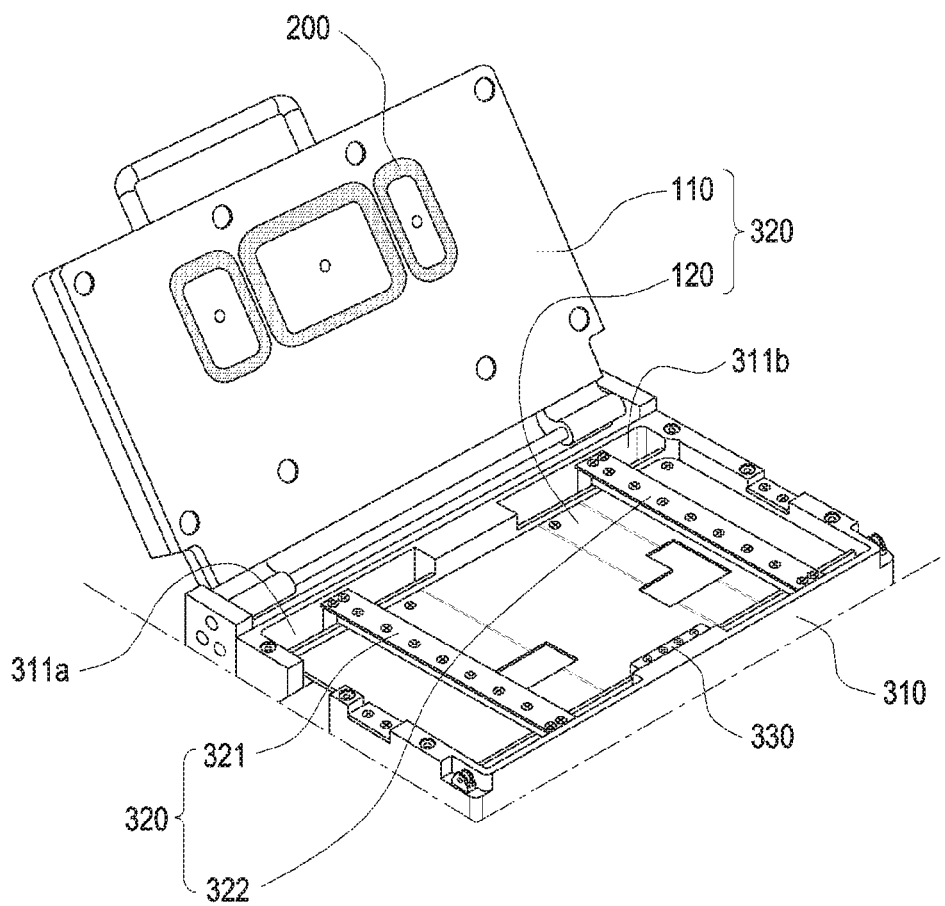
FIG. 17 is an enlarged view enlarging each component of a fixing unit 300, according to various embodiments of the present disclosure.

FIG. 15 is a perspective view showing a relationship in which the external electronic device 20 is fixed through the fixing unit 300, according to various embodiments of the present disclosure. FIG. 16 is a perspective view showing a partial region of the fixing unit 300 contacting the external electronic device 20, according to various embodiments of the present disclosure. FIG. 17 is an enlarged view enlarging each component of the fixing unit 300, according to various embodiments of the present disclosure.

According to various embodiments, the separable electronic device 10 may include the fixing unit 300, the heating unit 100, at least a part of which may be surrounded by the fixing unit 300, the adsorption unit 200 arranged adjacent to the fixing unit 300, and the driving unit 400 movable through a side of the fixing unit 300. The fixing unit 300 shown in FIGS. 15 through 17 may be entirely or partially the same as the fixing unit 300 shown in FIGS. 1 through 4.

In FIGS. 15 through 17, in a three-axis orthogonal coordinate system, 'X' may denote the length direction of the separable electronic device 10, 'Y' may denote the width direction of the separable electronic device 10, and 'Z' may denote the thickness direction of the separable electronic device 10. In an embodiment of the present disclosure, 'Z' may mean the first direction+Z and the second direction−Z, 'Y' may mean the third direction+Y and the fourth direction−Y, and 'X' may mean the fifth direction+X and the sixth direction−X.

Referring to FIGS. 15 through 17, the fixing unit 300 may include a bracket 310 that provides a space for accommodating the external electronic device 20, at least one fixing member 320 movably coupled with a partial region of the bracket 310, a guide member 330 fixed to the partial region of the bracket 310, and a handle portion 340 for controlling movement of the fixing member 320.

According to various embodiments, the bracket 310 may be formed to surround at least a part of the lower heating unit 120. The bracket 310 may be formed larger than a thickness (e.g., the first direction+Z or the second direction−Z) of the lower heating unit 120 to form an inner space by surrounding a side of the external electronic device 20 placed on the second base 121. In another example, the bracket 310 may be formed to correspond to an area of the upper heating unit 110, such that when the upper heating unit 110 rotates to close the separable electronic device 10, a side region of the bracket 310 and a bottom surface of the upper heating unit 110 may contact each other.

According to an embodiment, the bracket 310 may be open, as indicated by 350, on a partial region in a state of being supported by the support member 530 thereunder, thus providing a guide for upward or downward movement of a lift 410 of the driving unit 400 that is formed to protrude in the first direction+Z from the main body part 500. For example, when a plurality of lifts 410 of the driving unit 400 are formed, a plurality of through-openings 350 of the bracket 310 may be formed correspondingly.

According to an embodiment, the bracket 310 may be formed in the longitudinal direction, and may include guide grooves 311a and 311b for guiding movement while supporting the fixing member 320. For example, the bracket 310 may have a rectangular ring shape and the guide grooves 311a and 311b may be formed in two side portions 311 formed in the longitudinal direction. The guide grooves 311a and 311b may be formed in two pairs including a pair of first guide grooves 311a and 311b and the other pair of second guide grooves 311a and 311b that are formed spaced apart from the first guide grooves 311a and 311b.

According to an embodiment, when the external electronic device 20 is placed on the second base 121, the first guide groove 311a may guide movement of the fixing member 320 for fixing an upper bezel portion of the external electronic device 20. The first guide groove 311a may have a groove shape formed in the second direction−Z or in the third direction+Y and the fourth direction−Y, and may be arranged to support opposite end portions of the fixing member 320 to the same size as and in parallel with each other.

According to an embodiment, when the external electronic device 20 is placed on the second base 121, the second guide groove 311*b* may guide movement of the fixing member 320 for fixing a lower bezel portion of the external electronic device 20. The second guide groove 311*b* may have a groove shape formed in the second direction−Z or in the third direction+Y and the fourth direction−Y, and may be arranged to support the opposite end portions of the fixing member 320 to the same size as and in parallel with each other.

According to various embodiments, the fixing member 320 may be movably coupled with the guide grooves 311*a* and 311*b* to fix the external electronic device 20 placed on the second base 121. Through fixing of the fixing member 320, the adsorption unit 200 may stably adsorb and separate the surface of the external electronic device 20.

According to various embodiments, the fixing member 320 may include a first fixing member 321 supporting an upper bezel region of the external electronic device 20 and a second fixing member 322 supporting a lower bezel region of the external electronic device 20. Movement of the fixing member 320 in the fifth direction+X or in the sixth direction−X may be made separately or simultaneously, and may be automatically controlled by the control circuit or manually controlled by the user.

According to an embodiment, the first fixing member 321 may be movably coupled with the first guide groove 311*a* to fix the external electronic device 20, together with the second fixing member 322. The first fixing member 321 may be manufactured such that a partial region thereof is bent. For example, the first fixing member 321 may be provided in the shape of '⌐⌐', such that at least a part of a major axial portion may substantially contact an upper bezel of the external electronic device 20, and a minor axial portion corresponding to opposite end portions bent from the major axial portion may be coupled through insertion into the pair of the first guide grooves 311*a*.

According to an embodiment, the first fixing member 321 may include a first portion 323 formed of a metal material and a second portion 324 formed of a non-metal material. The first portion 323 is provided to globally support the first fixing member 321, and the second portion 324 may safely support an inclined step portion 325, as a portion substantially meeting the upper bezel region of the external electronic device 20, and the external electronic device 20 formed of the non-metal material. For example, the second portion 324 may include plastic. The second portion 324 may be coupled with the first portion 323 through a plurality of screws, etc., thus maintaining rigidity.

According to an embodiment, a surface directed in the fifth direction+X, of the second portion 324 of the first fixing member 321 may include the inclined step portion 325. The step portion 325 may support the external electronic device 20 with various sizes. In the step portion 325, an inclination or a step may be sequentially formed near the center in an upward direction or a downward direction.

According to an embodiment, the second fixing member 322 may be movably coupled with the second guide groove 311*b* to fix the external electronic device 20, together with the first fixing member 321. The second fixing member 322 may be manufactured such that a partial region thereof is bent. For example, the first fixing member 321 may be provided in the shape of '⌐⌐', such that at least a part of a major axial portion may substantially contact a lower bezel of the external electronic device 20, and a minor axial portion corresponding to opposite end portions bent from the major axial portion may be coupled through insertion into the pair of the second guide grooves 311*b*.

According to an embodiment, the second fixing member 322 may include the first portion 323 formed of a metal material and the second portion 324 formed of a non-metal material. The first portion 323 is provided to globally support the second fixing member 322, and the second portion 324 may safely support an inclined step portion 325, as a portion substantially meeting the lower bezel region of the external electronic device 20, and the external electronic device 20 formed of the non-metal material. For example, the second portion 324 may include plastic. The second portion 324 may be coupled with the first portion 323 through a plurality of screws, etc., thus maintaining rigidity.

According to an embodiment, a surface directed in the sixth direction−X, of the second portion 324 of the second fixing member 322 may include the inclined step portion 325. The step portion 325 may support the external electronic device 20 with various sizes. In the step portion 325, an inclination or a step may be sequentially formed near the center in the upward direction or the downward direction.

According to an embodiment, the first fixing member 321 and the second fixing member 322 may move in the fifth direction+X and/or in the sixth direction−X to fix the upper and lower bezel regions of the external electronic device 20 in contact with the upper and lower bezel regions, so as to fix a display portion of the external electronic device 20 without directly contacting the display portion. A damage of the display portion of the external electronic device 20 may be prevented and the front and rear covers may be separated stably.

According to various embodiments, the fixing unit 300 may include the guide member 330 supporting at least one surface of the external electronic device 20. The guide member 330 may be formed between the first fixing member 321 and the second fixing member 322 to support a side region of the external electronic device 20. For example, the guide member 330 may stably support at least three of side surfaces of the external electronic device 20, together with the first fixing member 321 and the second fixing member 322.

According to an embodiment, the guide member 330 may be arranged to be directed to an inner surface of the bracket 310 perpendicular to the fixing member 320. The guide member 330 may be supported by a region of the bracket 310 formed of a metal material, and may include a non-metal material. For example, the guide member 330 may include a plastic material. The guide member 330 may be coupled with a partial region of the bracket 310 through a plurality of screws, etc., thus maintaining rigidity.

According to various embodiments, the fixing unit 300 may include the handle portion 340 controlling movement of the fixing member 320. The handle portion 340 may be arranged to protrude outward from the bracket 310 and may rotate in the clockwise direction or the counterclockwise direction. The fixing member 320 may be moved toward the center of the second base 121 through rotation of the handle portion 340, and an excessive force may not be applied when the external electronic device 20 is fixed using, for example, a torque wrench, thereby preventing damage.

According to an embodiment, the handle portion 340 may be connected with a plurality of poles formed downward from the second base 121. The plurality of poles may be connected with the fixing member 320 to control movement of the fixing member 320 through rotation of the handle portion 340. The handle portion 340 may fix the external electronic device 20 with various sizes as the worker directly turns the handle portion 340.

Figure 18:
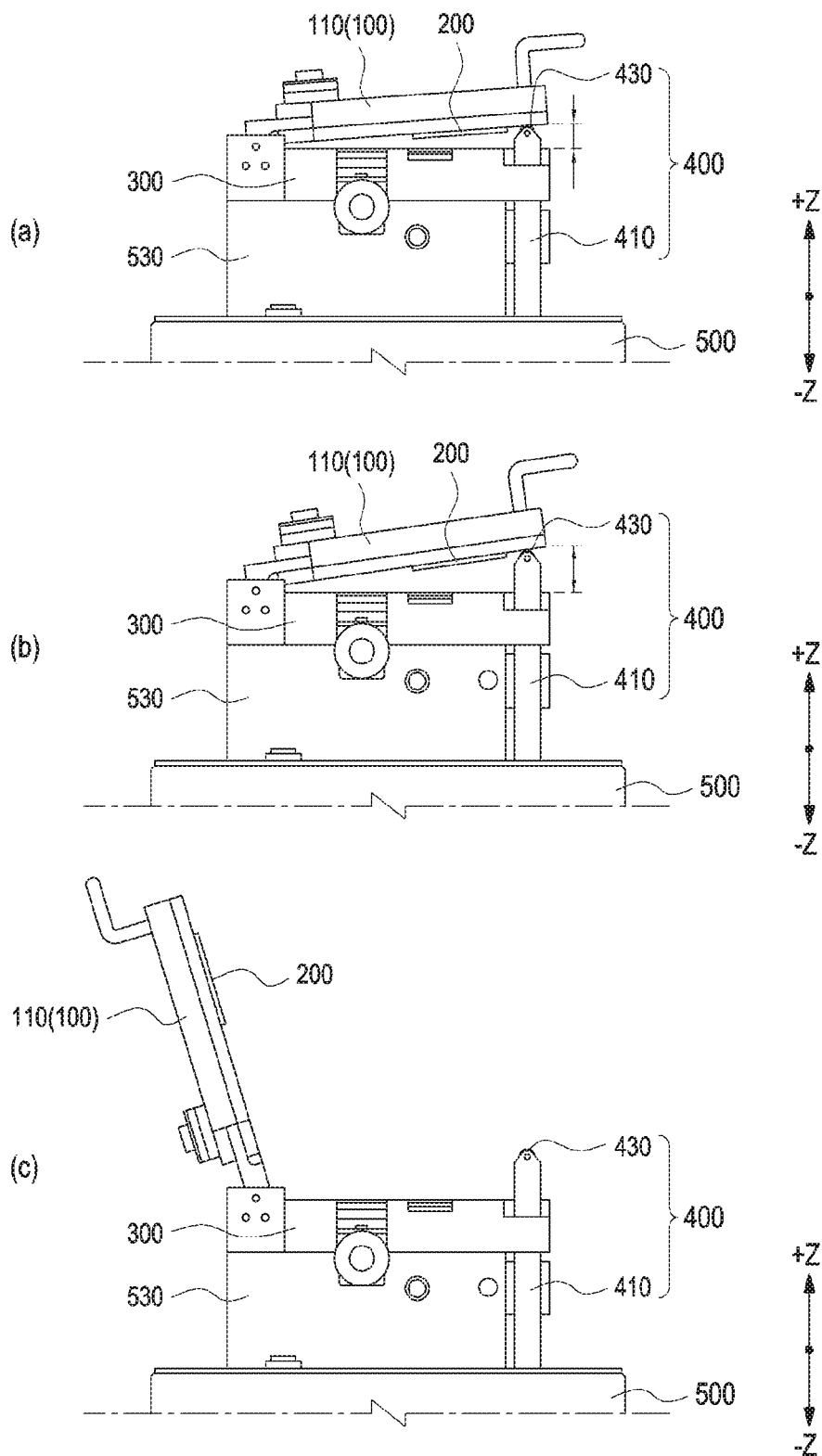
FIGS. 18A, 18B, and 18C illustrate operations of a driving unit 400 of a separable electronic device, according to various embodiments of the present disclosure.
Figure 19:
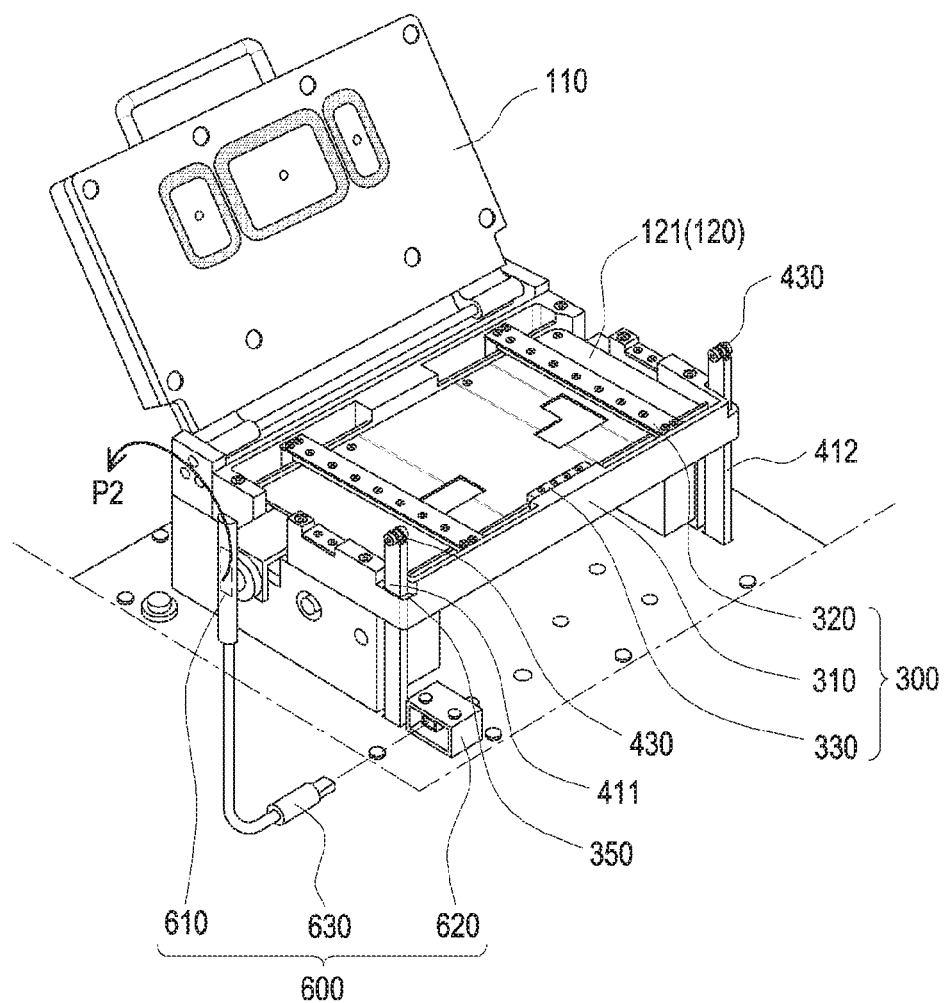
FIG. 19 is a perspective view showing a separable electronic device 10, viewed from a direction that is different from FIG. 18C.

FIGS. 18A, 18B, and 18C illustrate operations of the driving unit 400 of the separable electronic device 10, according to various embodiments of the present disclosure. FIG. 18A shows a first driving operation of the lift 410 of the driving unit 400, and FIG. 18B shows a second driving operation of the lift 410 of the driving unit 400. FIG. 18C shows an open state of the separable electronic device 10 through rotation of the upper heating unit 110 after completion of a driving operation of the driving unit 400. FIG. 19 is a perspective view showing the separable electronic device 10, viewed from a direction that is different from FIG. 18C.

According to various embodiments, the separable electronic device 10 may include the driving unit 400, the heating unit 400 that is rotatable through the driving unit 400, the adsorption unit 200 formed adjacent to the driving unit 400, the fixing unit 300, and the main body part 500 including the control circuit controlling driving and driving displacement of the driving unit 400. The fixing unit 400 shown in FIGS. 5 through 8 may be entirely or partially the same as the fixing unit 400 shown in FIGS. 1 through 4.

In FIGS. 5, 18A, 18B, 18C, and 19, in a three-axis orthogonal coordinate system, 'X' may denote the length direction of the separable electronic device 10, 'Y' may denote the width direction of the separable electronic device 10, and 'Z' may denote the thickness direction of the separable electronic device 10. In an embodiment of the present disclosure, 'Z' may mean the first direction+Z and the second direction−Z, 'Y' may mean the third direction+Y and the fourth direction−Y, and 'X' may mean the fifth direction+X and the sixth direction−X.

Referring to FIGS. 5, 18A, 18B, 18C, and 19, the driving unit 400 may be arranged to pass through a region of the fixing unit 300, and the upper heating unit 110 may be rotated to open the separable electronic device 10 through upward and downward (e.g., the first direction+Z and/or the second direction−Z) driving of the driving unit 400, The driving unit 400 may substantially include the lift 410 for upward and downward movement and a roller member 430 formed in an end portion of the lift 410. Position displacement along upward and downward movement of the lift 410 may be sensed through a sensor arranged inside the main body part 500.

According to various embodiments, the lift 410 may be provided in plural. The lift 410 may include a first lift 411 arranged in an end portion of the bracket 310 of the lower heating unit 120 and a second lift 412 spaced apart from the first lift 411 and arranged in the other end portion of the bracket 310 of the lower heating unit 120.

According to an embodiment, the first lift 411 may be arranged to pass through an opening of the bracket 310 from the inside of the main body part 500 via a through-hole of the main body part 500. The first lift 411 may be connected with a driving motor formed in the main body part 500 to move in the upward direction and in the downward direction (e.g., the first direction+Z and the second direction−Z). For example, when the first lift 411 moves in the first direction+Z, an end portion of the first lift 411 may contact at least a part of the bottom surface of the upper heating unit 110 to gradually space the upper heating unit 110 apart from the lower heating unit 120. The upper heating unit 110 may expose the second base 121 of the lower heating unit 120 to the outside through rotation. In another example, when the first lift 411 moves in the first direction+Z, at least one surface (e.g., the front cover or the rear cover) of the external electronic device 20 may rotationally move in the direction P2 (e.g., in the counterclockwise direction) together with the adsorbed adsorption member 210 and may be separated from the external electronic device 20. Along with rotational movement of the upper heating unit 110 and the adsorption member 210, the front cover and the rear cover of the external electronic device 20 may be gradually spaced apart from the second base 121, thus being stably separated.

In another example, when the second lift 412 moves in the first direction+Z, an end portion of the second lift 412 may contact at least a part of the bottom surface of the upper heating unit 110 to gradually space the upper heating unit 110 apart from the lower heating unit 120. The upper heating unit 110 may expose the second base 121 of the lower heating unit 120 to the outside through rotation. In another example, when the second lift 412 moves in the first direction+Z, at least one surface (e.g., the front cover or the rear cover) of the external electronic device 20 may rotationally move in the direction P2 together with the adsorbed adsorption member 210 and may be separated from the external electronic device 20. Along with rotation of the upper heating unit 110 and the adsorption member 210, the front cover and the rear cover of the external electronic device 20 may be gradually spaced apart from the second base 121, thus being stably separated.

According to an embodiment, the second lift 412 may move at the same speed as and in the same direction as the first lift 411. The first lift 411 and the second lift 412 may stably open the heating unit 100 while supporting opposite end portions of the upper heating unit 110. The control circuit of the main body part 500 may control the moving speed of the first lift 411 and the second lift 412 such that at least one surface (e.g., the front cover or the rear cover) of the external electronic device 20 may be stably separated without damage. For example, the speed of the first lift 411 and the second lift 412 moving in the first direction+Z, may be about 0.20 mm/sec-0.35 mm/sec. In another example, the speed of the first lift 411 and the second lift 412 moving in the first direction+Z may be about 0.28 mm/sec.

According to various embodiments, an operation of the driving unit 400 may be performed through a button arranged in the main body part 500. For example, a switch formed on the outer surface of the main body part 500 may include a plurality of buttons including a first operation button (e.g., an OCTA glass mode), a second operation button (e.g., a back glass mode), and a third operation button (e.g., a quick mode).

According to an embodiment, as shown in FIG. 18A, the first operation button may be configured such that a maximum spacing distance of the upper heating unit 110 to the lower heating unit 120 may be about 9 mm-13 mm. In another embodiment, the first operation button may be configured such that the maximum spacing distance of the upper heating unit 110 to the lower heating unit 120 may be about 11 mm. The first operation button may be used when the front cover of the external electronic device 20 is separated, and a sufficient spacing distance may be provided by avoiding mutual interference with the external electronic device 20, caused by thermal expansion of the lower heating unit 120. For example, a flexible printed circuit board (FPCB) arranged inside the front cover of the external electronic device 20 may be prevented from being damaged.

According to an embodiment, as shown in FIG. 18B, the second operation button may be configured such that a maximum spacing distance of the upper heating unit 110 to the lower heating unit 120 may be about 20 mm-30 mm. In another embodiment, the first operation button may be configured such that the maximum spacing distance of the upper heating unit 110 to the lower heating unit 120 may be about 25 mm. The second operation button may be used when the rear cover of the external electronic device 20 is separated, and the FPCB arranged inside the rear cover may be prevented from being damaged.

According to an embodiment, the third operation button may be configured such that a maximum spacing distance of the upper heating unit 110 to the lower heating unit 120 may be about 11 mm. The third operation button, which is a quick button, may be used for stable separation of the external electronic device 20, regardless of separation of the front cover or the rear cover. When the spacing distances based on the operation buttons are reached, a position sensor arranged in the electronic device may sense this and stop the operation. The position sensor may sense the spacing distances through a lamp to be described below, and operations of the position sensor and the lamp may be automatically controlled through the control circuit.

According to various embodiments, the roller member 430 may be arranged in an end portion of the lift, thus preventing a partial region of the upper heating unit 110 contacting the roller member 430 from being abraded and damaged. The roller member 430 may be formed by attaching a rotatable roller to the end portion of the lift, and may include an elastic material such as silicon, rubber, etc.

According to various embodiments, a lamp part 600 may be arranged in a region adjacent to the driving unit 400. The lamp part 600 may include a light source unit 610 emitting light toward the external electronic device 20, a lamp connector 620 electrically connectable with the main body part 500, and a cable 630 connecting the light source unit 610 with the lamp connector 620.

According to an embodiment, the light source unit 610 may be arranged spaced apart from the fixing unit 300, and emit light in a direction toward the second base 121. The lamp connector 620 may be mounted exposed from the main body part 500, and may be connected to be supplied with power from the main body part 500. The cable 630 may deliver power to the light source unit 610. The lamp part 600 may irradiate light to allow the worker to conveniently monitor a region in which separation of the external electronic device 20 is performed.

According to an embodiment, a position sensor (not shown) provided inside the main body part 500 or the fixing unit 300 may identify in real time, a process of separating the front cover or the rear cover of the external electronic device 20 through a lighting of the lamp part 600 and sense a spacing distance. The control circuit may control an operation of the driving unit according to the sensed spacing distance. The control circuit may control the lamp part 600 to be automatically turned on when separation of the lamp part 600 is performed and control the lamp part 600 to be automatically turned off when separation of the lamp part 600 is completed.

Hereinbelow, an operating process of the separable electronic device will be described in detail.

Figure 20:
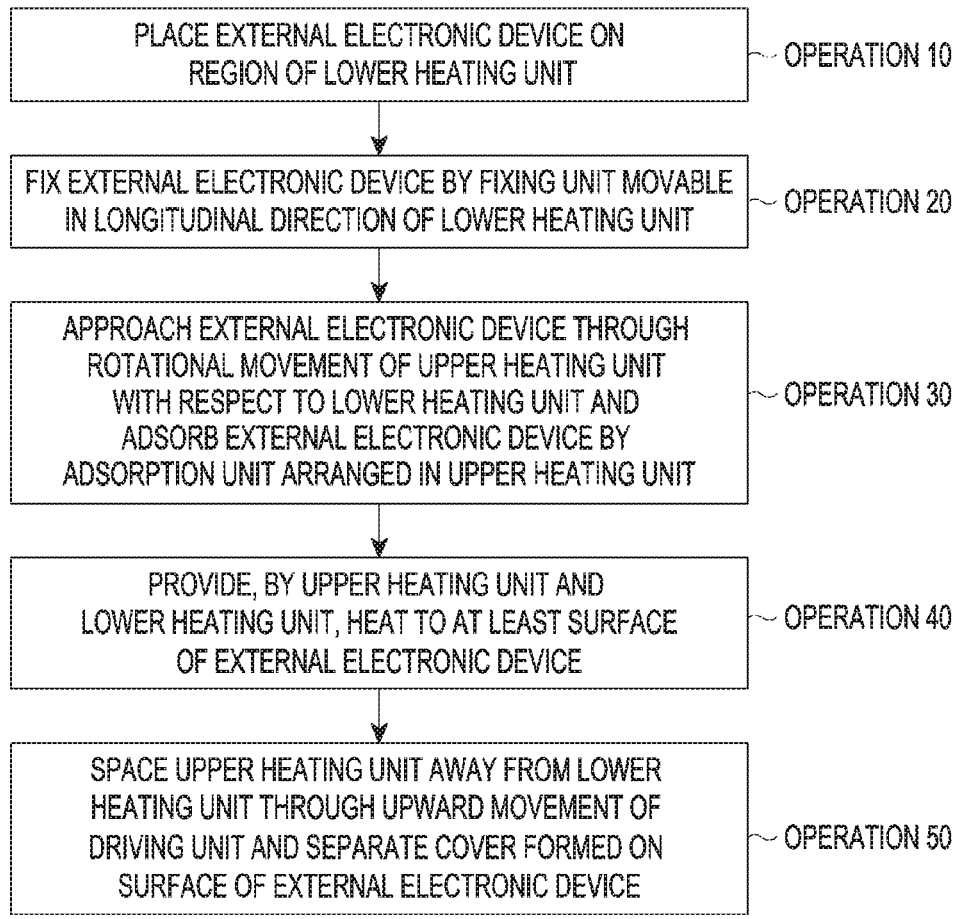
FIG. 20 is a flowchart illustrating operations of a separable electronic device, according to various embodiments of the present disclosure.

FIG. 20 is a flowchart illustrating operations of a separable electronic device, according to various embodiments of the present disclosure.

The operations of the separable electronic device refer to the structure of the separable electronic device 10 shown in FIGS. 1 through 19.

As shown in FIGS. 1 through 4, the separable electronic device 10 may include the main body portion 500, the heating unit 100, the adsorption unit 300, the fixing unit 300, and the driving unit 400. According to various embodiments, the separable electronic device 10 may safely separate at least a part of the outer surface of the external electronic device 20 (e.g., a mobile device). For example, the separable electronic device 10 may be an integral electronic device in which after the front cover or the rear cover is adsorbed, the external electronic device 20 may be globally heated and then after a preset time, the front cover or the rear cover may be automatically separated.

The separable electronic device may perform pre-heating before the external electronic device is placed. The pre-heating may be set to a predetermined default temperature to reduce a time required for a lead time before the heating unit is heated.

According to various embodiments, the separable electronic device may include the heating unit electrically connected with the main body part, and the heating unit may include the upper heating unit and the lower heating unit. When power is applied to the main body part and the user performs pre-heating with respect to the heating unit, the upper heating unit and the lower heating unit may operate with an automatically set predetermined temperature value.

According to an embodiment, the upper heating unit and the lower heating unit may perform pre-heating separately or simultaneously. The upper heating unit may have a heating temperature of 65-75 and the lower heating unit may have a heating temperature of 55-65. When the pre-heating temperature is reached, the control circuit may control the reached temperature to be maintained constant, and notify the worker of completion of the pre-heating through a signal such as an alarm, etc.

According to various embodiments, after or before completion of the pre-heating of the heating unit, the worker may perform an operation of placing the external electronic device on a base of the lower heating unit in operation 10. According to an embodiment, to place the external electronic device on the base, the upper heating unit may be rotated with respect to the lower heating unit, thus opening the heating unit.

According to an embodiment, the second base of the lower heating unit, as a surface on which the external electronic device is placed, may include grooves formed inward on at least a part thereof. The groove may be formed in plural and formed to have different sizes. The groove may secure a space inside the second base to protect a protruding portion (e.g., a camera) of the external electronic device, placed on the second base, from being damaged.

According to an embodiment, the second base of the lower heating unit, as the surface on which the external electronic device is placed, may include an extension line such that the external electronic device may be accurately placed. The extension line may be formed in plural in the widthwise direction of the second base, and each extension line may be formed to coincide with a virtual line extending in the longitudinal direction of the adsorption member arranged in the upper heating unit and/or the recess formed in the upper heating unit. As the extension line is formed, the external electronic device may be placed such that the upper or lower side surface of the external electronic device coincides with the extension line, thereby allowing the adsorption member arranged in the heating unit to sufficiently adsorb the surface of the external electronic device.

According to an embodiment, a plurality of extension lines may be provided in the base of the lower heating unit, thus positioning the external electronic device in an accurate region. For example, the external electronic device may be manufactured to various sizes, such that the external electronic device may be selectively positioned to coincide with the plurality of extension lines, according to each size of the external electronic device. Depending on a type of the external electronic device, separation of the front cover or the rear cover may be required. Thus, the external electronic device may be placed such that the front cover or the rear cover opposes the base.

According to various embodiments, after the external electronic device is placed on the base of the lower heating unit, a process of fixing the external electronic device to the base through the fixing unit may be performed in operation 20.

According to an embodiment, the fixing unit may include the bracket providing the space in which the external electronic device is accommodated, the at least one fixing member movably coupled with the partial region of the bracket, the guide member fixedly arranged in the partial region of the bracket, and the hand portion controlling movement of the fixing member.

According to an embodiment, the fixing member may be movably coupled with a guide groove formed in the bracket to fix the external electronic device placed in the second base. Through fixing of the fixing member, the adsorption unit may stably adsorb and separate the surface of the external electronic device.

According to an embodiment, the fixing member may include the first fixing member and the second fixing member, in which the first fixing member may operate to support the upper bezel region of the external electronic device and the second fixing member may operate to support the lower bezel region of the external electronic device. The operation of the fixing member may be performed separately or simultaneously, and may be automatically controlled by the control circuit or manually controlled by the user.

According to an embodiment, the fixing member may include the first portion formed of a metal material and the second portion formed of a non-metal material. The first portion may be provided to globally support the fixing member, and the second portion may safely support an inclined step portion, as a portion substantially meeting the upper bezel region of the external electronic device, and the external electronic device formed of the non-metal material.

According to an embodiment, the fixing unit may include the guide member supporting at least one surface of the external electronic device. The guide member may be formed between the first fixing member and the second fixing member to support a side region of the external electronic device. For example, the guide member may stably support at least three of side surfaces of the external electronic device, together with the first fixing member and the second fixing member.

According to an embodiment, the fixing unit may include the handle portion controlling movement of the fixing member. The handle portion may be arranged to protrude outward from the bracket and may rotate in the clockwise direction or the counterclockwise direction. After the external electronic device is temporarily fixed by completion of movement of the fixing member, the fixing member may be moved toward the center of the second base through rotation of the handle portion, and an excessive force may not be applied when the external electronic device is fixed using, for example, a torque wrench, thereby performing a stable fixing operation without a damage.

According to various embodiments, after the external electronic device is fixed to the second base through the fixing unit, the upper heating unit may approach the external electronic device by rotational movement with respect to the lower heating unit, and the adsorption unit arranged in the upper heating unit may adsorb the external electronic device in operation 30.

According to an embodiment, the adsorption unit may include a plurality of adsorption members and a plurality of adsorption holes arranged adjacent to the plurality of adsorption members. The adsorption member may include the first adsorption member formed in the central region of the upper heating unit and the second adsorption member and the third adsorption member that are arranged spaced apart from the first adsorption member.

According to an embodiment, the plurality of adsorption units may be formed in plural to correspond to the number of spaces formed by the plurality of adsorption members, and may include the adsorption hole that provides a vacuum space by sucking the air. For example, the adsorption hole may include the first adsorption hole, the second adsorption hole, and the third adsorption hole.

According to an embodiment, the adsorption member may be provided in the form of a closed line. The closed line may form a square shape with a rounded corner. In another example, the first adsorption member, the second adsorption member, and the third adsorption member may be formed to different sizes. For example, the length of a line formed by the first adsorption member may be longest and the length of a formed line may be reduced in an order of the second adsorption member and then the third adsorption member. According to the size of the adsorption member, a vacuum space formed on the surface of the external electronic device may be provided differently.

According to an embodiment, the adsorption unit may operate in a state where the upper heating unit opposes the lower heating unit. For example, a switch formed on an outer surface of the main body part may include a first adsorption button, a second adsorption button, and a third adsorption button, and when one or more of the buttons are pressed, the vacuum pump may operate and the adsorption member may adsorb a surface of the external electronic device to be separated. According to an embodiment, pressure formed in the vacuum space through the adsorption may be maintained as about 93 Kpa, and the adsorption may be maintained without the operation of the vacuum pump until the pressure decreases to about 10 Kpa or below.

According to an embodiment, the first adsorption unit, the second adsorption unit, and the third adsorption unit may set a vacuum pressure simultaneously or separately. For example, the first adsorption member may operate as a predetermined default pressure. In another example, based on the premise of the operation of the first adsorption member, the second adsorption member may operate to form and maintain the first vacuum space and the second vacuum space at the same time. In another example, based on the premise of the operation of the first adsorption member, the third adsorption member may operate to form and maintain the first vacuum space and the third vacuum space at the same time. In another example, based on the premise of the operation of the first adsorption member, the second and third adsorption members may operate to form and maintain the first vacuum space, the second vacuum space, and the third vacuum space at the same time.

According to various embodiments, upon completion of adsorption to a surface of the external electronic device, the upper heating unit and the lower heating unit may perform a process of providing heat to at least one surface of the external electronic device in operation 40.

According to an embodiment, the heating unit may include the upper heating unit, the lower heating unit, and the connection module coupling the upper heating unit with the lower coupling unit such that the upper heating unit may rotate with respect to the lower heating unit. The connection module may include a hinge structure including the rotational shaft, and the heating unit may rotate with respect to the lower heating unit along the rotational shaft to open or close at least a part of the separable electronic device.

According to an embodiment, the upper heating unit and the lower heating unit may include the heater member in which the heating wire is arranged, the base stacked on the surface of the heater member and providing heat generated in the heater member to the external electronic device, and the plate stacked on the other surface of the heater member and supporting the upper heating unit and the lower heating unit.

According to an embodiment, the upper heating unit may be heated through temperature control simultaneously with or separately from the lower heating unit. A switch formed on an outer surface of the main body part may include a pre-heating button (e.g., a pre-heating button), a first heating button (e.g., a heater upper button), and a second heating button (e.g., a heater lower button). After completion of adsorption of the external electronic device by the adsorption unit, through a present heating operation (e.g., pressing of the first heating button), the upper heating unit may be heated to about 60-80. In another example, through a heating operation (e.g., pressing of the first heating button), the upper heating unit may be heated to about 70. In another example, after completion of adsorption of the external electronic device by the adsorption unit, through a present heating operation (e.g., pressing of the second heating button), the lower heating unit may be heated to about 60-80. In another example, through a heating operation (e.g., pressing of the first heating button), the lower heating unit may be heated to about 70. According to an embodiment, the upper and lower heating units operate, such that a time for heating the external electronic device may be about 3 minutes-7 minutes. In another example, a time for heating the upper and lower heating units may be about 5 minutes.

According to an embodiment, when a threshold value of a pressure of the vacuum space is less than or equal to 40 Kpa during the heating, the vacuum pump may automatically operate to maintain a pressure for vacuum adsorption.

According to various embodiments, upon completion of the heating through the heating unit, a process of spacing the upper heating unit apart from the lower heating unit through upward movement of the driving unit and separating the cover formed on the surface of the external electronic device may be performed in operation 50.

According to an embodiment, the driving unit may include the lift for upward and downward movement and the roller member formed in the end portion of the lift. Position displacement along upward and downward movement of the lift may be sensed through a position sensor arranged inside the main body part.

According to an embodiment, the lift may be arranged to pass through an opening of the bracket from the inside of the main body part via a through-hole of the main body part. The lift may be connected with the driving motor formed inside the main body part to move upwardly or downwardly. For example, when the lift moves upwardly, the end portion of the lift may contact at least a part of the bottom surface of the upper heating unit to gradually space the upper heating unit away from the lower heating unit.

Thus, at least one surface (e.g., the front cover or the rear cover) of the external electronic device may rotationally move in the clockwise direction or in the counterclockwise direction, together with the adsorbed adsorption member, and separation from the external electronic device may be performed. Along with rotational movement of the upper heating unit and the adsorption member, the front cover and the rear cover of the external electronic device may be gradually spaced apart from the second base, thus being stably separated.

According to an embodiment, the control circuit of the main body part may control the moving speed of the lift such that at least one surface (e.g., the front cover or the rear cover) of the external electronic device may be stably separated without damage. For example, the upwardly moving speed of the lift may be about 0.20 mm/sec-0.35 mm/sec. In another example, the upwardly moving speed of the lift may be about 0.20 mm/sec 0.28 mm/sec.

According to an embodiment, the operation of the driving unit may be performed by the button arranged in the main body part. For example, a switch formed on the outer surface of the main body part may include a plurality of buttons including the first operation button (e.g., the OCTA glass mode), the second operation button (e.g., the back glass mode), and the third operation button (e.g., the quick mode). The first operation button may be configured such that a maximum spacing distance of the upper heating unit to the lower heating unit may be about 9 mm-13 mm. In another embodiment, the first operation button may be configured such that the maximum spacing distance of the upper heating unit to the lower heating unit may be about 11 mm. The first operation button may be used when the front cover of the external electronic device is separated, and a sufficient spacing distance may be provided by avoiding mutual interference with the external electronic device, caused by thermal expansion of the lower heating unit. Thus, an FPCB arranged inside the front cover of the external electronic device 20 may be prevented from being damaged.

According to an embodiment, the second operation button may be configured such that a maximum spacing distance of the upper heating unit to the lower heating unit may be about 20 mm-30 mm. In another embodiment, the first operation button may be configured such that the maximum spacing distance of the upper heating unit to the lower heating unit may be about 25 mm. The second operation button may be used when the rear cover of the external electronic device is separated, and the FPCB arranged inside the rear cover may be prevented from being damaged.

According to an embodiment, the third operation button may be configured such that a maximum spacing distance of the upper heating unit to the lower heating unit may be about 11 mm. The third operation button, which is a quick button, may be used for stable separation of the external electronic device 20, regardless of separation of the front cover or the rear cover. When the spacing distances based on the operation buttons are reached, a position sensor arranged in the electronic device may sense this and stop the operation. The position sensor may sense the spacing distances, and operations of the position sensor and the lamp may be automatically controlled through the control circuit.

According to an embodiment, at least one separation groove may be formed in a region of the upper heating unit to assist cover separation of the heating-completed external electronic device. For example, the at least one separation groove may rapidly decompress a pressure of the vacuum space to release adsorption, such that the cover separated from the external electronic device may be easily separated and damage prevention may be facilitated.

According to an embodiment, the lamp part may be arranged to check separation of the external electronic device during separation, and the lamp part may be automatically turned on or off according to whether the operation is performed or not. In another example, upon completion of separation, the control circuit may deliver a signal such as an alarm, etc., and when the external electronic device is separated from the separable electronic device, the control circuit may stop the signal.

The separable electronic device and the separation process according to various embodiments of the present disclosure may reduce a repair cost by minimizing damage to the front cover and the rear cover of the external electronic device. Table 1 shows a test result with the separable electronic device according to the present disclosure.

TABLE 1

|  | OCTA | Back Glass | Subtotal |
|---|---|---|---|
| Disassembling case | 1,354 | 2,637 | 3,991 |
| Damage case | 11 | 7 | 18 |
| Damage rate | 0.81% | 0.27% | 0.45% |

The separable electronic device and the separation process according to various embodiments of the present disclosure may minimize a heat loss through a non-stop process with in-line integral equipment, thereby removing a damage potential factor.

For example, in separation of the external electronic device through an existing device, a damage rate was about 6.1%, but in separation according to the present disclosure, a damage rate was about 1.0% or less, thus being reduced by about 5.1%. In another example, a time for disassembling and repairing the external electronic device through non-stop processing was about 16 minutes in a related art, but the time according to the present disclosure was reduced to about 6.5 minutes, thus being reduced by about 9 minutes or more.

An electronic device according to various embodiments of the present disclosure may include.

a heating unit including a lower heating unit and an upper heating unit rotatably coupled with the lower heating unit, and heating an external electronic device placed on at least one surface of the lower heating unit, a fixing unit arranged adjacent to the lower heating unit, at least a part of the fixing unit being formed to move in a longitudinal direction of the lower heating unit to fix the external electronic device, an adsorption unit, a part of which is inserted into at least one recess formed in the upper heating unit, to adsorb at least a region of the external electronic device, and a driving unit arranged in a side or in a periphery of the heating unit, being movable perpendicular to a moving direction of the fixing unit, and rotating the upper heating unit by pressurizing the upper heating unit.

According to various embodiments, the upper heating unit and the lower heating unit may include the heater member in which the heating wire is arranged, the base stacked on the surface of the heater member and providing heat generated in the heater member to the external electronic device, and the plate stacked on the other surface of the heater member and supporting the upper heating unit and the lower heating unit.

According to various embodiments, the recess may include a first recess formed in a central region of the base of the upper heating unit and a second recess spaced apart from the first recess, and the base of the lower heating unit may include at least one extension line providing a placing position of the external electronic device.

According to various embodiments, the adsorption unit may include at least one adsorption member corresponding to the at least one recess and provided in a closed line shape and at least one adsorption hole formed to pass through the upper heating unit and connected with a vacuum pump to maintain a predetermined pressure in a space formed by the adsorption member.

According to various embodiments, the at least one adsorption member may include an elastic material, and the adsorption member, a region of the upper heating unit surrounded by the adsorption member, and a region of the external electronic device adsorbed by the adsorption member form one vacuum space.

According to various embodiments, the fixing unit may include a bracket formed to surround at least a part of the lower heating unit, at least one fixing member movable in a longitudinal direction of the bracket and supporting opposite side surfaces of the external electronic device, and a handle portion controlling movement of the fixing member.

According to various embodiments, the at least one fixing member may include a first fixing member supporting a side surface of the external electronic device and a second fixing member supporting the other side surface opposing the side surface, and a portion of the first fixing member and the second fixing member, which contacts the external electronic device, may include a non-metal material, and the portion may include an inclined step corresponding to a thickness of a side of the external electronic device.

According to various embodiments, the driving unit may include at least one lift moving perpendicular to a moving direction of the fixing member and at least one roller member formed in an end portion of the at least one lift and contacting the upper heating unit.

According to various embodiments, the movement of the lift may provide rotational movement of the upper heating unit, and a cover may be sequentially separated from the external electronic device from a side of the adsorption member of the adsorption unit toward the other side of the adsorption member, along with rotation of the upper heating unit.

According to various embodiments, the separable electronic device may further include a position sensor unit arranged adjacent to the driving unit and sensing a moving distance of the at least one lift of the driving unit.

According to various embodiments, the separable electronic device may further include a lamp unit arranged in a region of the bracket and irradiating light toward a side surface region of the external electronic device and a separation groove arranged adjacent to the at least one adsorption hole and formed inwardly from the upper heating unit.

According to various embodiments, the separable electronic device may further include a main body part arranged in the lower heating unit, and the main body part may include a housing and a control circuit arranged inside the housing and controlling at least one of a heating temperature of the heating unit, an adsorption pressure provided to the adsorption unit, or a moving speed of the driving unit.

According to various embodiments, the separable electronic device may further include a data input unit and a data output unit that are formed exposed outside the main body part, the data input unit inputting data of the control circuit and the data output unit checking an operation of the separable electronic device.

A processing method of a separable electronic device according to various embodiments of the present disclosure may include.

Placing an external electronic device in a region of a lower heating unit, fixing the external electronic device, by a fixing unit movable in a longitudinal direction of the lower heating unit, approaching the external electronic device through rotational movement of an upper heating unit with respect to the lower heating unit and adsorbing the external electronic device, by an adsorption unit arranged in the upper heating unit, providing heat to at least one surface of the external electronic device, by the upper heating unit and the lower heating unit, and spacing the upper heating unit away from the lower heating unit through upward movement of the driving unit and separating a cover formed on a surface of the external electronic device.

According to various embodiments, the processing method may further include pre-heating a placing region of the separable electronic device, by the upper heating unit and the lower heating unit, before placing the external electronic device in the region of the lower heating unit, in which the upper heating unit has a pre-heating temperature of 65-75 and the lower heating unit has a pre-heating temperature of 55-65.

According to various embodiments, in the operation of fixing the external electronic device by the fixing unit, the fixing unit may include a first fixing member and a second fixing member, and the first fixing member may move to support an upper bezel region of the external electronic device and the second fixing member may move to support a lower bezel region of the external electronic device.

According to various embodiments, the operation of adsorbing the external electronic device by the adsorption unit arranged in the upper heating unit may include an operation in which at least one adsorption member provided in a closed line shape contacts a surface of the external electronic device and an operation in which a predetermined pressure is formed in a space surrounded by the adsorption member and a region of the external electronic device, through an adsorption hole connected with a vacuum pump.

According to various embodiments, in the operation of adsorbing the external electronic device by the adsorption unit arranged in the upper heating unit, a pressure of a vacuum space formed by the adsorption member and the region of the external electronic device may be maintained as 40 Kpa or higher.

According to various embodiments, in the operation of providing, by the upper heating unit and the lower heating unit, heat to the at least one surface of the external electronic device, heating may be performed to maintain a temperature of the upper heating unit and the lower heating unit as 60-80, and a time for heating the external electronic device may have a value of 3 minutes-7 minutes.

According to various embodiments, the separating of the cover formed on the surface of the external electronic device may include vertically moving at least one lift toward the upper heating unit, in which a maximum spacing distance of the upper heating unit to the lower heating unit may have a value of 9 mm-13 mm through movement of the at least one lift.

According to various embodiments, the separating of the cover formed on the surface of the external electronic device may include vertically moving at least one lift toward the upper heating unit, in which a maximum spacing distance of the upper heating unit to the lower heating unit may have a value of 20 mm-30 mm through movement of the at least one lift.

The electronic device according to various embodiments of the present disclosure is not limited by the above-described embodiments and drawings, and it would be apparent to those of ordinary skill in the art that various substitutions, modifications, and changes in the technical scope of the present disclosure may be possible.

The invention claimed is:

1. An electronic device comprising:
   a heating unit comprising a lower heating unit and an upper heating unit rotatably coupled with the lower heating unit, and heating an external electronic device placed on at least one surface of the lower heating unit;
   a fixing structure disposed adjacent to the lower heating unit, at least a part of the fixing structure being formed to move in a longitudinal direction of the lower heating unit to fix the external electronic device;
   an adsorption structure, a part of which is inserted into at least one recess formed in the upper heating unit, to adsorb at least a region of the external electronic device; and
   a driving unit disposed in a side or in a periphery of the heating unit, being movable in perpendicular to a moving direction of the fixing structure, and rotating the upper heating unit by pressurizing the upper heating unit,
   wherein the driving unit comprises:
      at least one lift moving in perpendicular to a moving direction of the longitudinal direction; and
      at least one roller member formed in an end portion of the at least one lift and contacting the upper heating unit.

2. The electronic device of claim 1, wherein at least one of the upper heating unit and the lower heating unit comprise:
   a heater member comprising a heating wire disposed therein;
   a base stacked on a first surface of the heater member and providing heat generated in the heater member to the external electronic device; and
   a plate stacked on a second surface of the heater member and supporting the upper heating unit and the lower heating unit.

3. The electronic device of claim 2, wherein the at least one recess comprises a first recess formed in a central region of the base of the upper heating unit and a second recess spaced apart from the first recess, and
   the base of the lower heating unit comprises at least one extension line providing a placing position of the external electronic device.

4. The electronic device of claim 1, wherein the adsorption structure comprises:
   at least one adsorption member provided in a closed line shape; and
   at least one adsorption hole formed to pass through the upper heating unit and connected with a vacuum pump to maintain a predetermined pressure in a space formed by the adsorption member.

5. The electronic device of claim 4, wherein the at least one adsorption member comprise an elastic material, and
   the at least one adsorption member, a region of the upper heating unit surrounded by the at least one adsorption member, and a region of the external electronic device adsorbed by the at least one adsorption member form one vacuum space.

6. The electronic device of claim 4, wherein the fixing structure comprises:
   a bracket formed to surround at least a part of the lower heating unit;

at least one fixing member movable in a longitudinal direction of the bracket and supporting opposite side surfaces of the external electronic device; and
a handle portion controlling movement of the fixing member, and
wherein the at least one fixing member comprises a first fixing member supporting a side surface of the external electronic device and a second fixing member supporting the other side surface opposing the side surface, and
wherein a portion of the first fixing member and the second fixing member, which contacts the external electronic device, comprises a non-metal material, and the portion of the first fixing member and the second fixing member comprises an inclined step corresponding to a thickness of a side of the external electronic device.

7. The electronic device of claim 6,
wherein the movement of the lift provides rotational movement of the upper heating unit, and
wherein a cover is sequentially separated from the external electronic device from a first side of the at least one adsorption member of the adsorption structure toward a second side of the at least one adsorption member, along with rotation of the upper heating unit.

8. The electronic device of claim 7, further comprising a position sensor unit arranged adjacent to the driving unit and sensing a moving distance of the at least one lift of the driving unit.

9. The electronic device of claim 6, further comprising:
a lamp unit disposed in a region of the bracket and irradiating light toward a side surface region of the external electronic device; and
a separation groove disposed adjacent to the at least one adsorption hole and formed inwardly from the upper heating unit.

10. The electronic device of claim 1, further comprising a main body part arranged in the lower heating unit, and
wherein the main body part comprises:
a housing;
a control circuit disposed inside the housing and controlling at least one of a heating temperature of the heating unit, an adsorption pressure provided to the adsorption structure, or a moving speed of the driving unit; and
a data input unit and a data output unit that are formed exposed outside the main body part, the data input unit inputting data of the control circuit and the data output unit checking an operation of the electronic device.

11. A processing method of an electronic device, the processing method comprising:
placing an external electronic device in a region of a lower heating unit;
fixing the external electronic device to the electronic device, by a fixing structure movable in a longitudinal direction of the lower heating unit;
adsorbing the external electronic device, by an adsorption structure arranged in an upper heating unit as the upper heating unit rotates with respect to the lower heating unit and;
providing heat to at least one surface of the external electronic device, by the upper heating unit and the lower heating unit; and
spacing the upper heating unit away from the lower heating unit through upward movement of a driving unit and separating a cover formed on a surface of the external electronic device,
wherein the driving unit comprises:
at least one lift moving in perpendicular to a moving direction of the longitudinal direction; and
at least one roller member formed in an end portion of the at least one lift and contacting the upper heating unit.

12. The processing method of claim 11, further comprising pre-heating a placing region of the electronic device, by the upper heating unit and the lower heating unit, before placing the external electronic device in the region of the lower heating unit,
wherein the upper heating unit has a pre-heating temperature of 65° C.-75° C. and the lower heating unit has a pre-heating temperature of 55° C.-65° C.

13. The processing method of claim 11, wherein in the fixing the external electronic device by the fixing structure, the fixing structure comprises a first fixing member and a second fixing member, and
the first fixing member moves to support an upper bezel region of the external electronic device and the second fixing member moves to support a lower bezel region of the external electronic device.

14. The processing method of claim 11, wherein the adsorbing the external electronic device by the adsorption structure arranged in the upper heating unit comprises:
control at least one adsorption member provided in a closed line shape to contact a surface of the external electronic device; and
forming a predetermined pressure in a space surrounded by the adsorption member and a region of the external electronic device, through an adsorption hole connected with a vacuum pump, and
maintaining a pressure of a vacuum space formed by the adsorption member and the region of the external electronic device as 40 KPa or higher.

15. The processing method of claim 11, wherein in the providing, by the upper heating unit and the lower heating unit, heat to the at least one surface of the external electronic device, heating is performed to maintain a temperature of the upper heating unit and the lower heating unit as 60° C.-80° C., and a time for heating the external electronic device has a value of 3 minutes-7 minutes.

* * * * *